United States Patent
Lin et al.

(10) Patent No.: US 10,679,707 B2
(45) Date of Patent: Jun. 9, 2020

(54) VOLTAGE ADJUSTING METHOD, MEMORY CONTROLLING CIRCUIT UNIT AND MEMORY STORAGE DEVICE

(71) Applicant: PHISON ELECTRONICS CORP., Miaoli (TW)

(72) Inventors: Wei Lin, Taipei (TW); Yu-Cheng Hsu, Yilan County (TW); Tsai-Hao Kuo, Tainan (TW); Szu-Wei Chen, New Taipei (TW); Lih Yuarn Ou, Taipei (TW); Hsiao-Yi Lin, Yilan County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 150 days.

(21) Appl. No.: 16/120,313

(22) Filed: Sep. 3, 2018

(65) Prior Publication Data
US 2020/0035306 A1    Jan. 30, 2020

(30) Foreign Application Priority Data
Jul. 24, 2018   (TW) .............................. 107125541 A

(51) Int. Cl.
G06F 3/01      (2006.01)
G11C 16/26    (2006.01)
G06F 11/10    (2006.01)
G11C 29/52    (2006.01)
G06F 3/06      (2006.01)
G11C 16/04    (2006.01)
G11C 11/56    (2006.01)

(52) U.S. Cl.
CPC ............ *G11C 16/26* (2013.01); *G06F 3/0604* (2013.01); *G06F 3/0619* (2013.01); *G06F 3/0632* (2013.01); *G06F 3/0679* (2013.01); *G06F 11/1068* (2013.01); *G11C 16/0483* (2013.01); *G11C 29/52* (2013.01); *G11C 11/5671* (2013.01)

(58) Field of Classification Search
CPC .............................. G11C 16/26; G06F 3/0632
USPC ....................................................... 711/103
See application file for complete search history.

(56) References Cited

U.S. PATENT DOCUMENTS 9,478,292 B2 * 10/2016 Sun ........................ G11C 16/10
2004/0264227 A1 * 12/2004 Kojima ................ G11C 7/1006
365/45

(Continued)

OTHER PUBLICATIONS

"Office Action of Taiwan Counterpart Application," dated Mar. 18, 2019, p. 1-p. 6.

*Primary Examiner* — Jae U Yu
(74) *Attorney, Agent, or Firm* — JCIPRNET

(57) ABSTRACT

A voltage adjusting method, a memory controlling circuit unit and a memory storage device are provided. The method includes: reading a first physical programming unit in a first physical programming unit group to obtain first data; correcting the first data according to a first error check and correction code corresponding to the first data to obtain first corrected data; reading a second physical programming unit in the first physical programming unit group to obtain second data; and adjusting a first read voltage for reading a first memory cell to a second read voltage according to the first data, the first corrected data, and the second data.

21 Claims, 18 Drawing Sheets

(56) References Cited

U.S. PATENT DOCUMENTS

2011/0317488 A1\* 12/2011 Tseng ................ G11C 11/5628
365/185.09
2016/0179615 A1 6/2016 Lee \* cited by examiner

| Lower physical programming unit | Middle physical programming unit | Upper physical programming unit |
|---|---|---|
| 0 | 1 | 2 |
| 3 | 4 | 5 |
| 6 | 7 | 8 |
| 9 | 10 | 11 |
| 12 | 13 | 14 |
| ⋮ | ⋮ | ⋮ |
| 255 | 256 | 257 |

FIG. 10

| Memory Cell | C1 | C2 | C3 | C4 | C5 | C6 | C7 | C8 |
|---|---|---|---|---|---|---|---|---|
| LX1 | 1 | 0 | 1 | 1 | 0 | 1 | 1 | 1 |
| LP1 | 1 | 1 | 1 | 0 | 0 | 0 | 0 | 0 |
| UP1 | 0 | 0 | 1 | 0 | 0 | 0 | 1 | 0 |

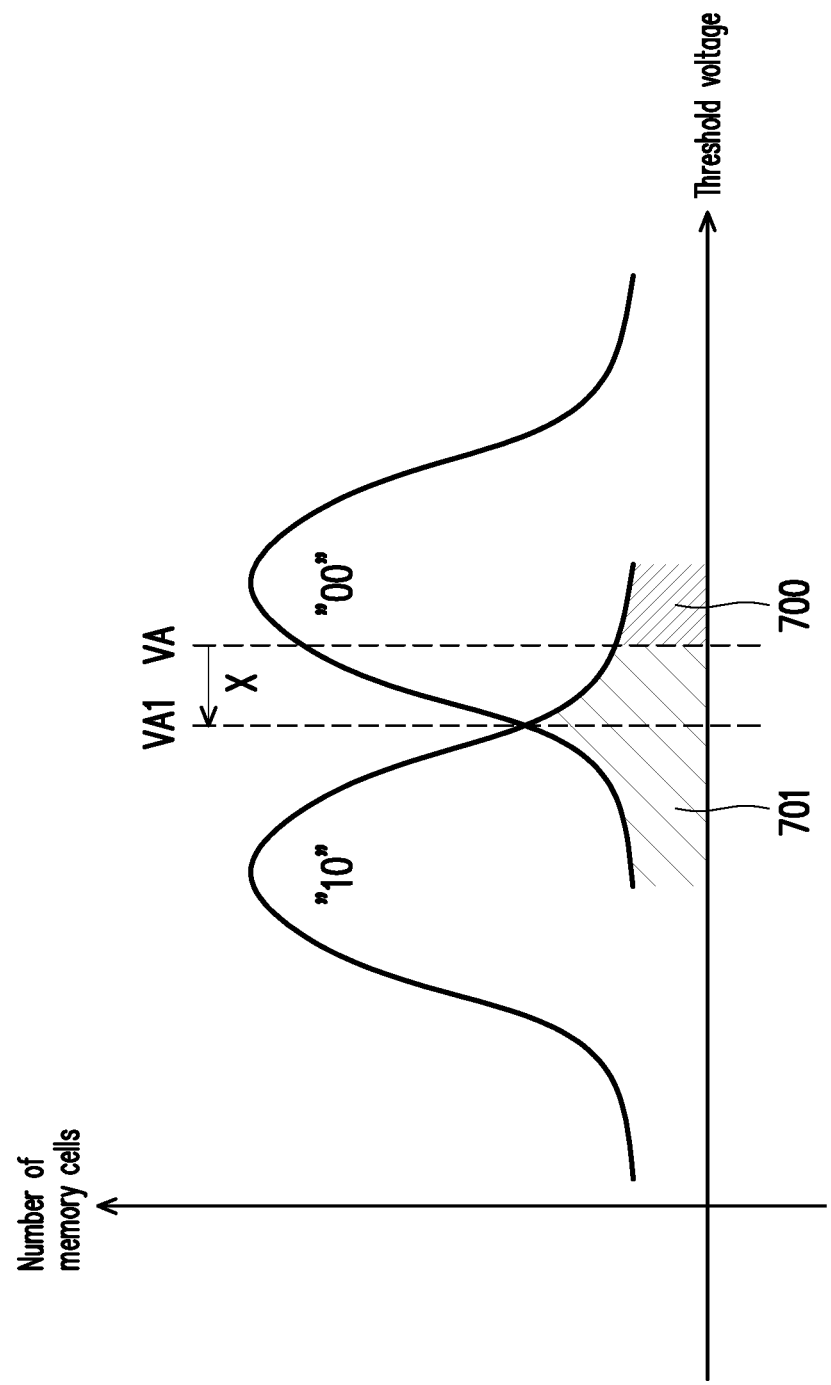

| Memory cell | C1 | C2 | C3 | C4 | C5 | C6 | C7 | C8 |
|---|---|---|---|---|---|---|---|---|
| LX2 | 1 | 1 | 1 | 1 | 0 | 1 | 1 | 1 |
| LP2 | 1 | 0 | 1 | 0 | 1 | 0 | 0 | 0 |
| MP2 | 0 | 1 | 0 | 0 | 0 | 0 | 0 | 0 |
| UP2 | 1 | 0 | 1 | 1 | 0 | 1 | 0 | 1 |

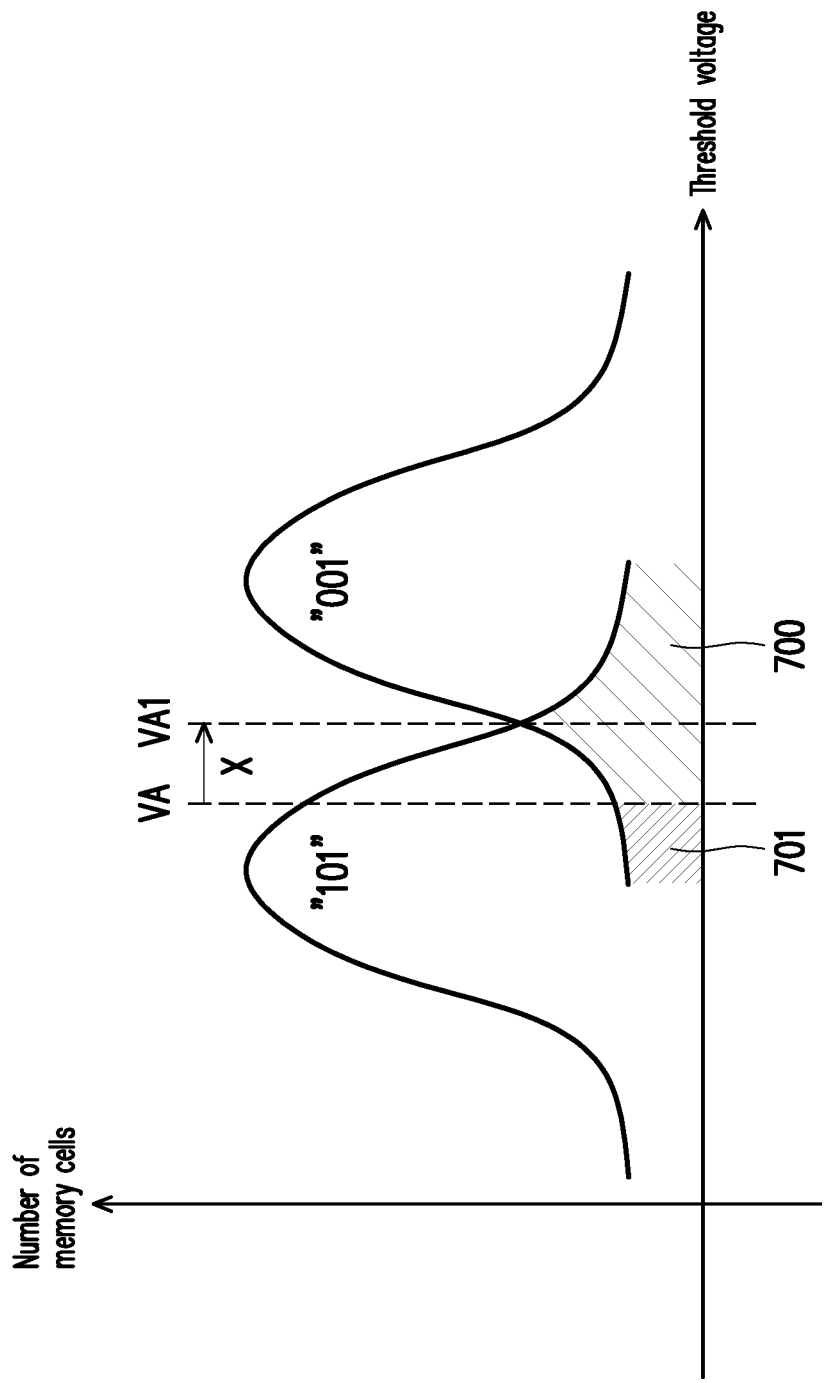

VOLTAGE ADJUSTING METHOD, MEMORY CONTROLLING CIRCUIT UNIT AND MEMORY STORAGE DEVICE

CROSS-REFERENCE TO RELATED APPLICATION

This application claims the priority benefit of Taiwan application serial no. 107125541, filed on Jul. 24, 2018. The entirety of the above-mentioned patent application is hereby incorporated by reference herein and made a part of this specification.

BACKGROUND

Technical Field

The invention relates to a voltage adjusting method, a memory controlling circuit unit and a memory storage device.

Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., a flash memory) ideal to be built in the portable multi-media devices as cited above.

In general, when using a read voltage to read data from the rewritable non-volatile memory module, a memory management circuit can perform a decoding operation on the read data in order to obtain the desired read data. However, when the decoding operation is failed, the memory management circuit would perform a retry-read mechanism to re-obtain another read voltage, and use said another read voltage for a reading operation, so as to re-obtain the read data for the decoding operation. The memory management circuit performs the same decoding operation according to re-obtained verification bits to obtain another decoded data composed of a plurality of decoded bits. The retry-read mechanism for re-obtaining the read voltage may be repeatedly performed until the number of times of re-obtaining the read voltage exceeds a preset number of times.

In particular, with the retry-read mechanism, an optimal read voltage for reading a plurality of memory cells located on the same word line may be obtained, and this optimal read voltage may be used to read data from said memory cells and successfully decode the data. Nonetheless, it should be noted that, the optimal read voltage for reading the memory cells on one word line may not be suitable for reading the memory cells on another word line. In other words, the optimal read voltage for reading the memory cells on one word line may not be the optimal read voltage for reading the memory cells on another word line. An order of using a plurality of retry-read voltages when determining the optimal read voltage for reading the memory cells on one word line may not be suitable for determining the optimal read voltage for reading the memory cells on another word line. Therefore, the process for determining the optimal read voltage would normally reduce a performance of the memory controller. Accordingly, how to quickly find the optimal read voltage for reading the memory cells is one of the issues to be addressed by person skilled in the art.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The invention is directed to a voltage adjusting method, a memory controlling circuit unit and a memory storage device, which are capable of effectively calculating the optimal read voltage for reading memory cells to be used in the subsequent reading operation. Accordingly, a probability of successful decoding may be increased and a number of retry-reads may be reduced so as to effectively improve a performance of the memory controller.

The invention provides a voltage adjusting method for a rewritable non-volatile memory module. The rewritable non-volatile memory module includes a plurality of memory cells, and the memory cells are disposed on intersections between a plurality of word lines and a plurality of bit lines. The word lines include a first word line, and a first physical programming unit group is formed by a plurality of first memory cells among the memory cells located on the first word line. The voltage adjusting method includes: reading a first physical programming unit in the first physical programming unit group to obtain first data; correcting the first data according to a first error check and correction code corresponding to the first data to obtain first corrected data; reading at least one second physical programming unit in the first physical programming unit group to obtain second data; and adjusting a first read voltage for reading the first memory cells to a second read voltage according to the first data, the first corrected data, and the second data.

The invention provides a memory controlling circuit unit for a rewritable non-volatile memory module. The rewritable non-volatile memory module includes a plurality of memory cells, and the memory cells are disposed on intersections between a plurality of word lines and a plurality of bit lines. The word lines include a first word line, and a first physical programming unit group is funned by a plurality of first memory cells among the memory cells located on the first word line. The memory controlling circuit unit includes a host interface, a memory interface and a memory management circuit. The host interface is configured to couple to a host system. The memory interface is configured to couple to a rewritable non-volatile memory module. The memory management circuit is coupled to the host interface and the memory interface. The memory management circuit is configured perform the following operations: reading a first physical programming unit in the first physical programming unit group to obtain first data; correcting the first data according to a first error check and correction code corresponding to the first data to obtain first corrected data; reading at least one second physical programming unit in the first physical programming unit group to obtain second data; and adjusting a first read voltage for reading the first memory cells to a second read voltage according to the first data, the first corrected data, and the second data.

The invention provides a memory storage device, which includes a connection interface unit, a rewritable non-volatile memory module and a memory controlling circuit unit. The connection interface unit is configured to couple to a host system. The rewritable non-volatile memory module includes a plurality of memory cells, and the memory cells are disposed on intersections between a plurality of word lines and a plurality of bit lines. The word lines include a first word line, and a first physical programming unit group is formed by a plurality of first memory cells among the memory cells located on the first word line. The memory controlling circuit unit is coupled to the connection interface unit and the rewritable non-volatile memory module. The memory controlling circuit unit is configured to perform the following operations: reading a first physical programming unit in the first physical programming unit group to obtain first data; correcting the first data according to a first error check and correction code corresponding to the first data to obtain first corrected data; reading at least one second physical programming unit in the first physical programming unit group to obtain second data; and adjusting a first read voltage for reading the first memory cells to a second read voltage according to the first data, the first corrected data, and the second data.

Based on the above, the voltage adjusting method, the memory controlling circuit unit and the memory storage device of the invention can be used to effectively calculate the optimal read voltage for reading the memory cells to be used in the subsequent reading operation. Accordingly, the probability of successful decoding may be increased and the number of retry-reads may be reduced so as to effectively improve the performance of the memory management circuit.

To make the above features and advantages of the invention more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 10 is a schematic diagram illustrating management of physical erasing units according to an exemplary embodiment.

FIG. 14A to FIG. 14C are schematic diagrams illustrating how the read voltage is adjusted according to a first exemplary embodiment.

FIG. 15A to FIG. 15C are schematic diagrams illustrating how the read voltage is adjusted according to a second exemplary embodiment.

DESCRIPTION OF THE EMBODIMENTS

Figure 1:
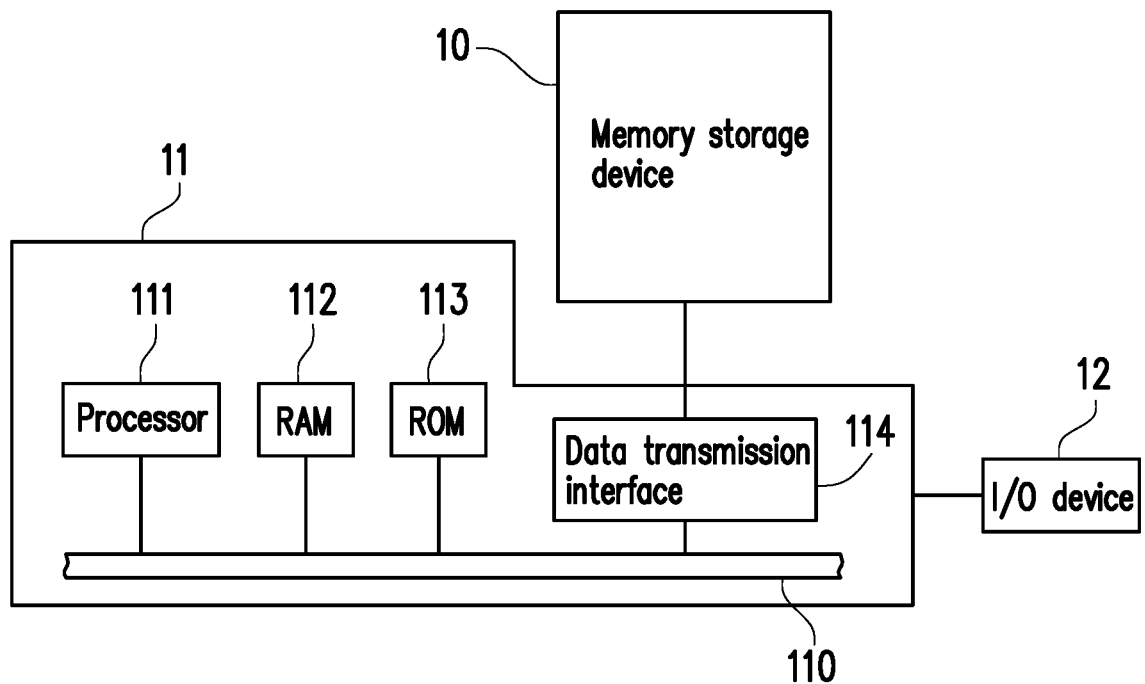
FIG. 1 is a schematic diagram illustrating a host system, a memory storage device and an I/O (input/output) device according to an exemplary embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

In general, a memory storage device (a.k.a. a memory storage system) includes a rewritable non-volatile memory module and a controller (a.k.a. a control circuit). The memory storage device usually operates together with a host system so the host system can write data into the memory storage device or read data from the memory storage device.

Figure 2:
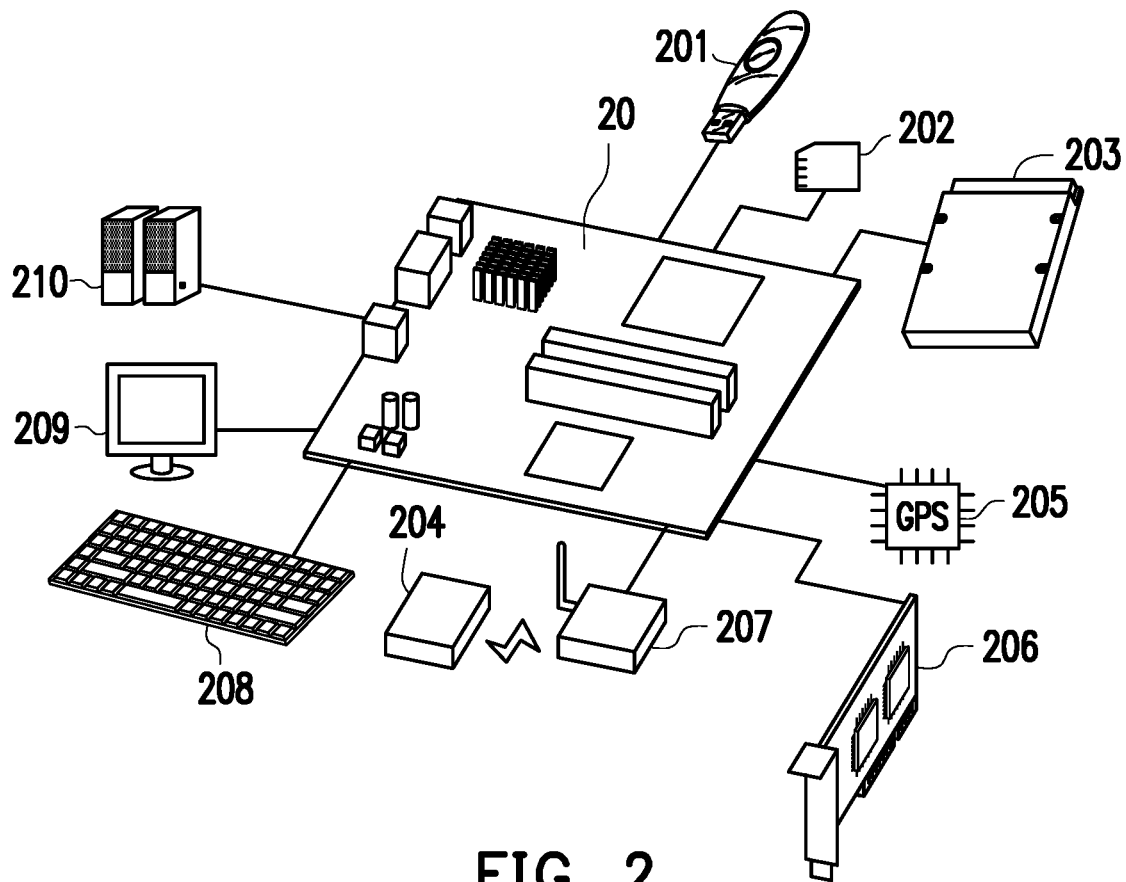
FIG. 2 is a schematic diagram illustrating a host system, a memory storage device and an I/O device according to another exemplary embodiment of the invention.

FIG. 1 is a schematic diagram illustrating a host system, a memory storage device and an I/O (input/output) device according to an exemplary embodiment of the invention. FIG. 2 is a schematic diagram illustrating a host system, a memory storage device and an I/O device according to another exemplary embodiment of the invention.

Referring to FIG. 1 and FIG. 2, a host system 11 generally includes a processor 111, a RAM (random access memory) 112, a ROM (read only memory) 113 and a data transmission interface 114. The processor 111, the RAM 112, the ROM 113 and the data transmission interface 114 are coupled to a system bus 110.

In this exemplary embodiment, the host system 11 is coupled to a memory storage device 10 through the data transmission interface 114. For example, the host system 11 can store data into the memory storage device 10 or read data from the memory storage device 10 through the data transmission interface 114. Further, the host system 11 is coupled to an I/O device 12 via the system bus 110. For example, the host system 11 can transmit output signals to the I/O device 12 or receive input signals from the I/O device 12 via the system bus 110.

In the present exemplary embodiment, the processor 111, the RAM 112, the ROM 113 and the data transmission interface 114 may be disposed on a main board 20 of the host system 11. The number of the data transmission interface 114 may be one or more. Through the data transmission interface 114, the main board 20 may be coupled to the memory storage device 10 in a wired manner or a wireless manner. The memory storage device 10 may be, for example, a flash drive 201, a memory card 202, a SSD (Solid State Drive) 203 or a wireless memory storage device 204. The wireless memory storage device 204 may be, for example, a memory storage device based on various wireless communication technologies, such as a NFC (Near Field Communication) memory storage device, a WiFi (Wireless Fidelity) memory storage device, a Bluetooth memory storage device, a BLE (Bluetooth low energy) memory storage device (e.g., iBeacon). Further, the main board 20 may also be coupled to various I/O devices including a GPS (Global Positioning System) module 205, a network interface card 206, a wireless transmission device 207, a keyboard 208, a monitor 209 and a speaker 210 through the system bus 110. For example, in an exemplary embodiment, the main board 20 can access the wireless memory storage device 204 via the wireless transmission device 207.

Figure 3:
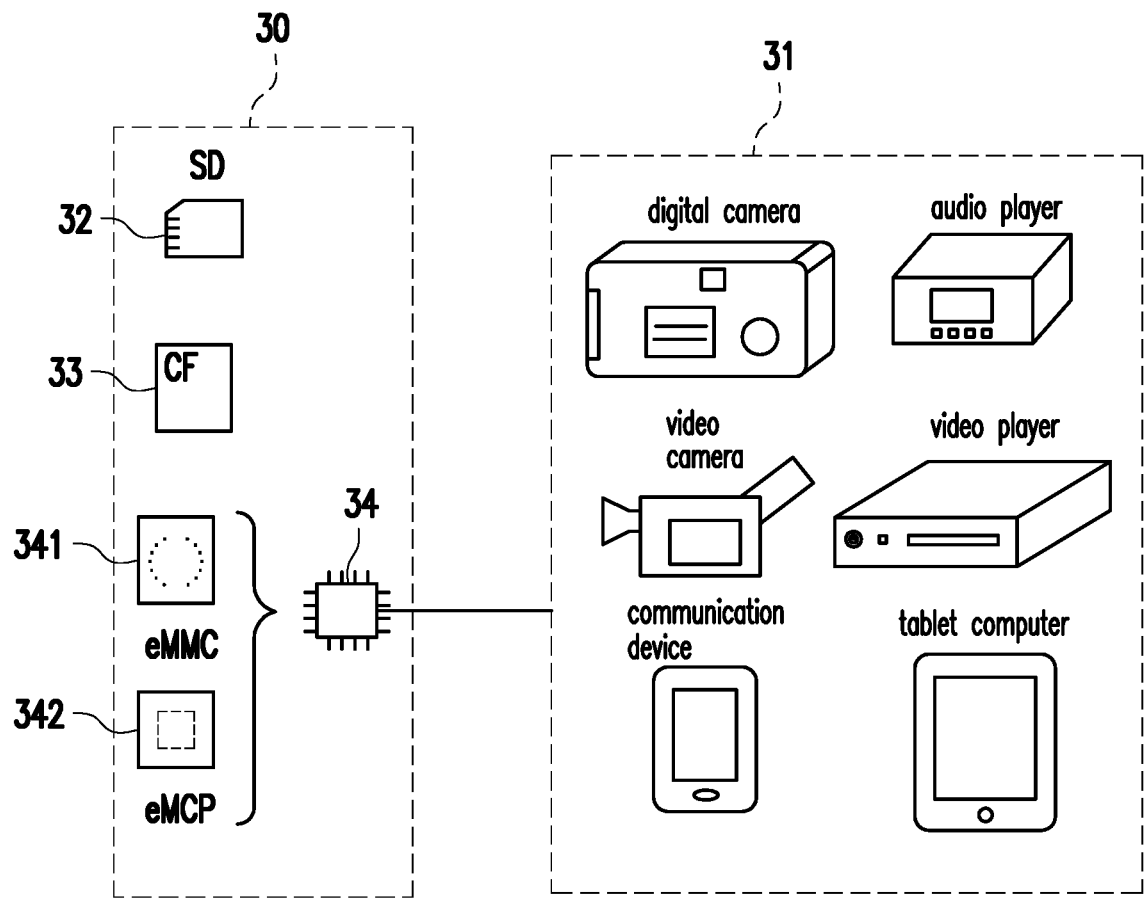
FIG. 3 is a schematic diagram illustrating a host system and a memory storage device according to another exemplary embodiment of the invention.

In an exemplary embodiment, aforementioned host system may be any system capable of substantially cooperating with the memory storage device for storing data. Although the host system is illustrated as a computer system in foregoing exemplary embodiment, nonetheless, FIG. 3 is a schematic diagram illustrating a host system and a memory storage device according to another exemplary embodiment of the invention. Referring to FIG. 3, in another exemplary embodiment, a host system 31 may also be a system including a digital camera, a video camera, a communication device, an audio player, a video player or a tablet computer, and a memory storage device 30 may be various non-volatile memory storage devices used by the host system, such as a SD card 32, a CF card 33 or an embedded storage device 34. The embedded storage device 34 includes various embedded storage devices capable of directly coupling a memory module onto a substrate of the host system, such as an eMMC (embedded MMC) 341 and/or an eMCP (embedded Multi Chip Package) 342.

Figure 4:
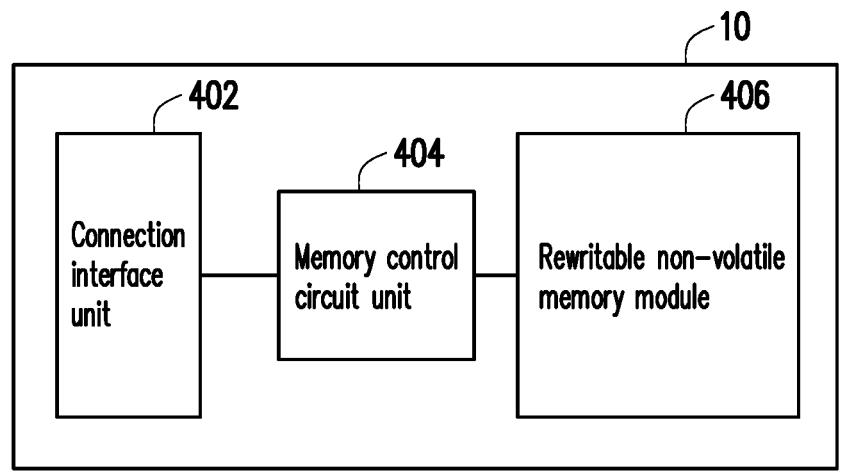
FIG. 4 is a schematic block diagram illustrating a memory storage device according to an exemplary embodiment of the invention.

FIG. 4 is a schematic block diagram illustrating a memory storage device according to an exemplary embodiment of the invention.

Referring to FIG. 4, the memory storage device 10 includes a connection interface unit 402, a memory controlling circuit unit 404 and a rewritable non-volatile memory module 406.

In this embodiment, the connection interface unit 402 is compatible with a SATA (Serial Advanced Technology Attachment) standard. Nevertheless, it should be understood that the invention is not limited in this regard. The connection interface unit 402 may also be compatible to a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a SD (Secure Digital) interface standard, a UHS-I (Ultra High Speed-I) interface standard, a UHS-II (Ultra High Speed-II) interface standard, a MS (Memory Stick) interface standard, a Multi-Chip Package interface standard, a MMC (Multi Media Card) interface standard, an eMMC (Embedded Multimedia Card) interface standard, a UFS (Universal Flash Storage) interface standard, an eMCP (embedded Multi Chip Package) interface standard, a CF (Compact Flash) interface standard, an IDE (Integrated Device Electronics) interface standard or other suitable standards. The connection interface unit 402 and the memory controlling circuit unit 404 may be packaged into one chip, or the connection interface unit 402 is distributed outside of a chip containing the memory controlling circuit unit 404.

The memory controlling circuit unit 404 is configured to execute a plurality of logic gates or control commands which are implemented in a hardware form or in a firmware form and perform operations, such as writing, reading or erasing data in the rewritable non-volatile memory module 406 according to the commands of the host system 11.

The rewritable non-volatile memory module 406 is coupled to the memory controlling circuit unit 404 and configured to store data written from the host system 11. The rewritable non-volatile memory module 406 may be a SLC (Single Level Cell) NAND flash memory module (i.e., a flash memory module capable of storing one bit in one memory cell), a MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), other flash memory modules or any memory module having the same features.

The memory cells in the rewritable non-volatile memory module 406 are disposed in an array. The memory cell array is described below using a two-dimensional array. However, it should be noted that, the following exemplary embodiment is simply an example of the memory cell array. In other exemplary embodiments, a disposition method of the memory cell array may be adjusted to satisfy actual requirements.

Figure 5:
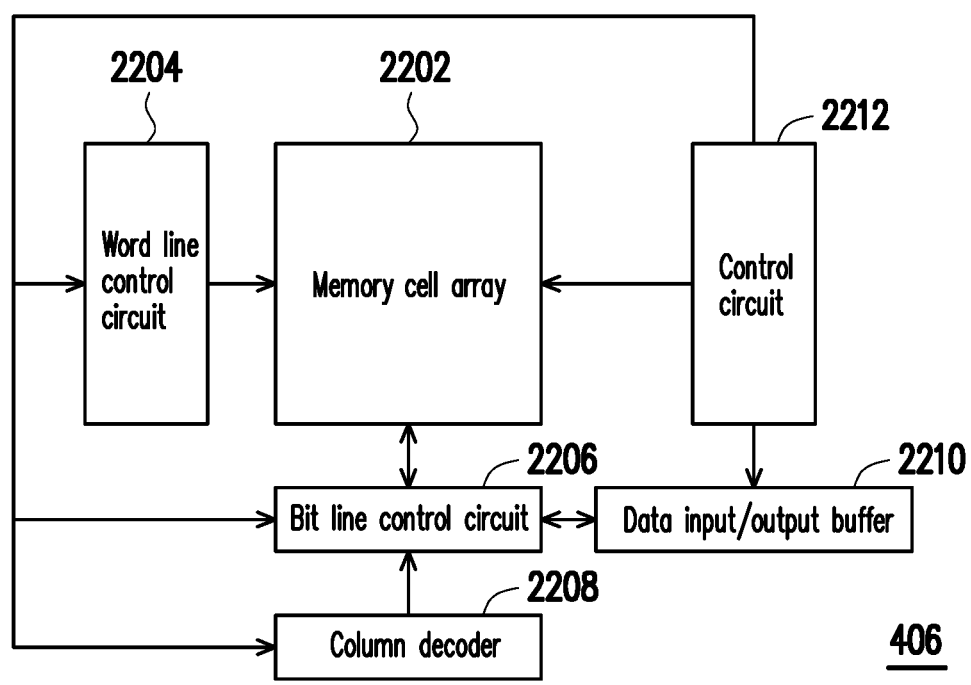
FIG. 5 is a schematic block diagram illustrating a rewritable non-volatile memory module according to an exemplary embodiment.
Figure 6:
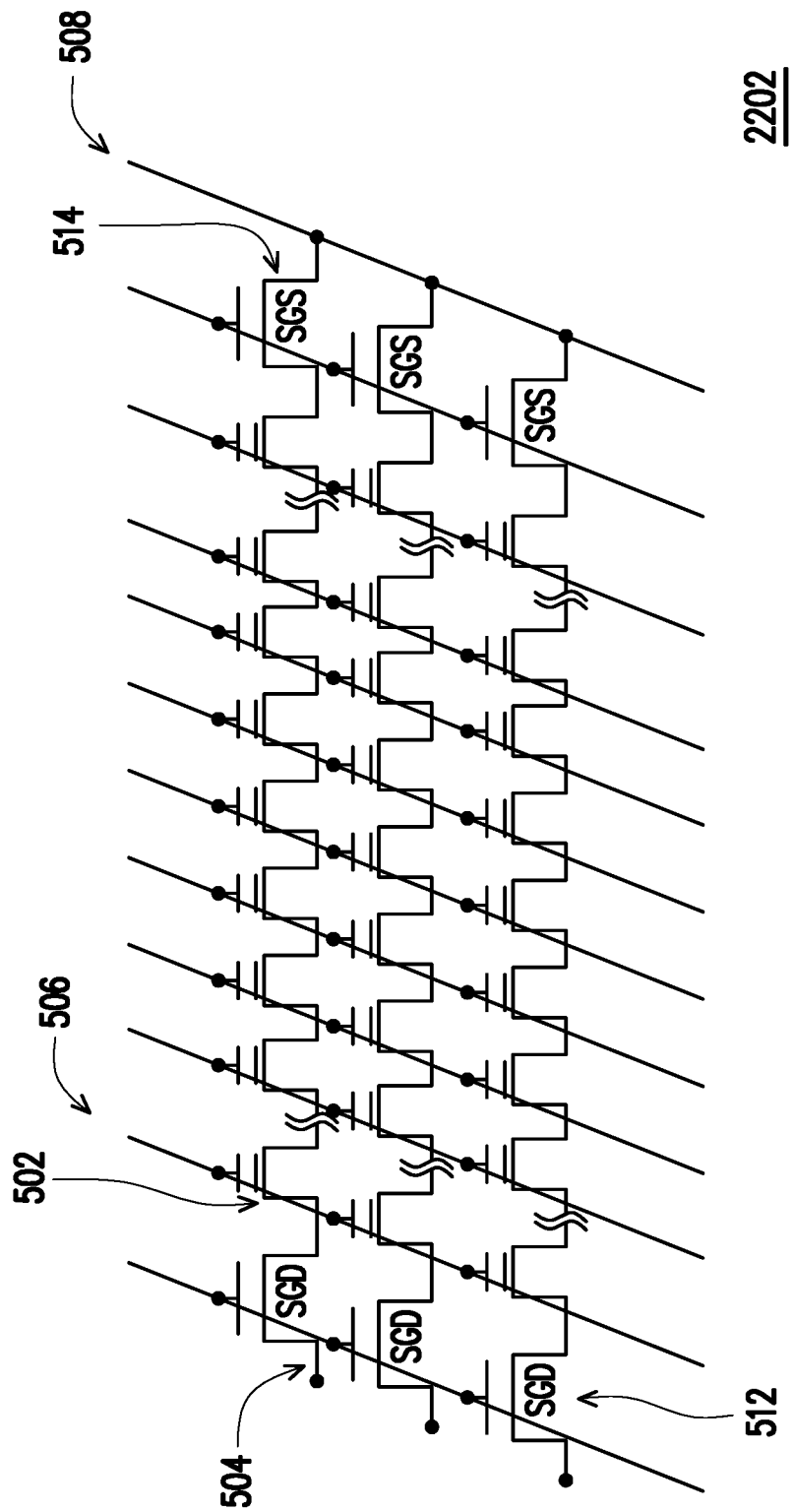
FIG. 6 is a schematic diagram illustrating a memory cell array according to an exemplary embodiment.

FIG. 5 is a schematic block diagram illustrating a rewritable non-volatile memory module according to an exemplary embodiment. FIG. 6 is a schematic diagram illustrating a memory cell array according to an exemplary embodiment.

Referring to FIG. 5 and FIG. 6 together, the rewritable non-volatile memory module 406 includes a memory cell array 2202, a word line control circuit 2204, a bit line control circuit 2206, a column decoder 2208, a data input/output buffer 2210 and a control circuit 2212.

In the present exemplary embodiment, the memory cell array 2202 may include a plurality of memory cells 502 used to store data, a plurality of select gate drain (SGD) transistors 512, a plurality of select gate source (SGS) transistors 514, as well as a plurality of bit lines 504, a plurality of word lines 506, a common source line 508 connected to the memory cells (as shown in FIG. 6). The memory cell 502 is disposed at intersections of the bit lines 504 and the word lines 506 in a matrix manner (or in a 3D stacking manner). When a write command or a read command is received from the memory controlling circuit unit 404, the control circuit 2212 controls the word line control circuit 2204, the bit line control circuit 2206, the column decoder 2208, the data input-output buffer 2210 to write the data into the memory cell array 2202 or read the data from the memory cell array 2202, wherein the word line control circuit 2204 is configured to control voltages applied to the word lines 506, the bit line control circuit 2206 is configured to control voltages applied to the bit lines 504, the column decoder 2208 is configured to select the corresponding bit line according to a row address in a command, and the data input/output buffer 2210 is configured to temporarily store the data.

The memory cell in the rewritable non-volatile memory module 406 may store multiple bits by changing a threshold voltage of one memory cell. More specifically, in each of the memory cells, a charge trapping layer is provided between a control gate and a channel. Amount of electrons in the charge trapping layer may be changed by applying a write voltage to the control gate thereby changing the threshold voltage of the memory cell. This process of changing the threshold voltage is also known as "writing data into the memory cell" or "programming the memory cell". Each of the memory cells in the memory cell array 2022 has a plurality of storage statuses depended on changes in the threshold voltage. A read voltage can be used to determine what storage state the memory cell belongs to, so as to obtain the bit stored by the memory cell.

Figure 7:
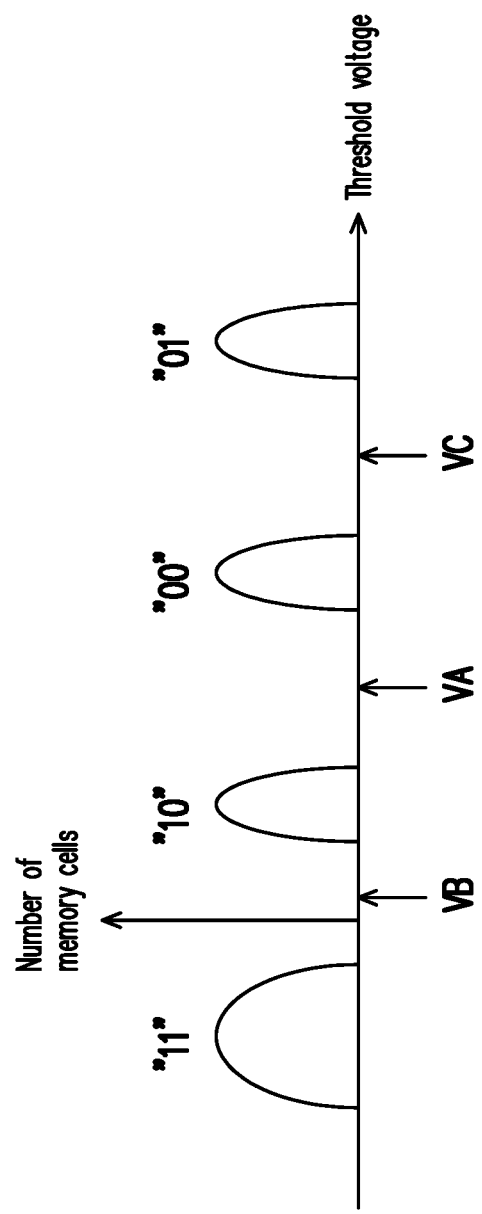
FIG. 7 is a histogram of a gate voltage corresponding to write data stored in the memory cell array according to an exemplary embodiment.

FIG. 7 is a histogram of a gate voltage corresponding to write data stored in the memory cell array according to an exemplary embodiment.

Referring to FIG. 7 that takes the MLC NAND flash memory for example, in which each of the memory cells has four storage states depending on different threshold voltages, and the storage states represent bits "11", "10", "00" and "01", respectively. In other words, each of the storage states includes a least significant bit (LSB) and a most significant bit (MSB). In the present exemplary embodiment, among the storage states (i.e., "11", "10", "00" and "01"), a first bit counted from the left is the LSB, and a second bit counted from the left is the MSB. Accordingly, in this exemplary embodiment, each of the memory cells can store two bits. It should be understood that, the threshold voltages and the corresponding storage states illustrated in the FIG. 7 are merely an example. In another exemplary embodiment of the invention, the threshold voltages and the corresponding storage states may also have an arrangement of "11", "10", "01" and "00" that is arranged according to the threshold voltage from small to large, or have other arrangements. In addition, in another exemplary embodiment, it can also be defined that the first bit counted from the left is the MSB, and the second bit counted from the left is the LSB.

In an exemplary embodiment where one memory cell is capable of storing multiple bits (e.g., the MLC or TLC flash memory module), the physical programming units belonging to the same word line may at least be classified into a lower physical programming unit and an upper physical programming unit. For instance, in the MLC NAND flash memory module, a least significant bit (LSB) of a memory cell belongs to the lower physical programming unit, and a most significant bit (MSB) of one memory cell belongs to the upper physical programming unit. In an exemplary embodiment, the lower physical programming unit is also known as a fast page, and the upper physical programming unit is also known as a slow page. In addition, in the TLC NAND flash memory module, a least significant bit (LSB) of a memory cell belongs to the lower physical programming unit, a center significant bit (CSB) of that memory cell belongs to a middle physical programming unit, and a most significant bit (MSB) of that memory cell belongs to the upper physical programming unit.

Figure 8:
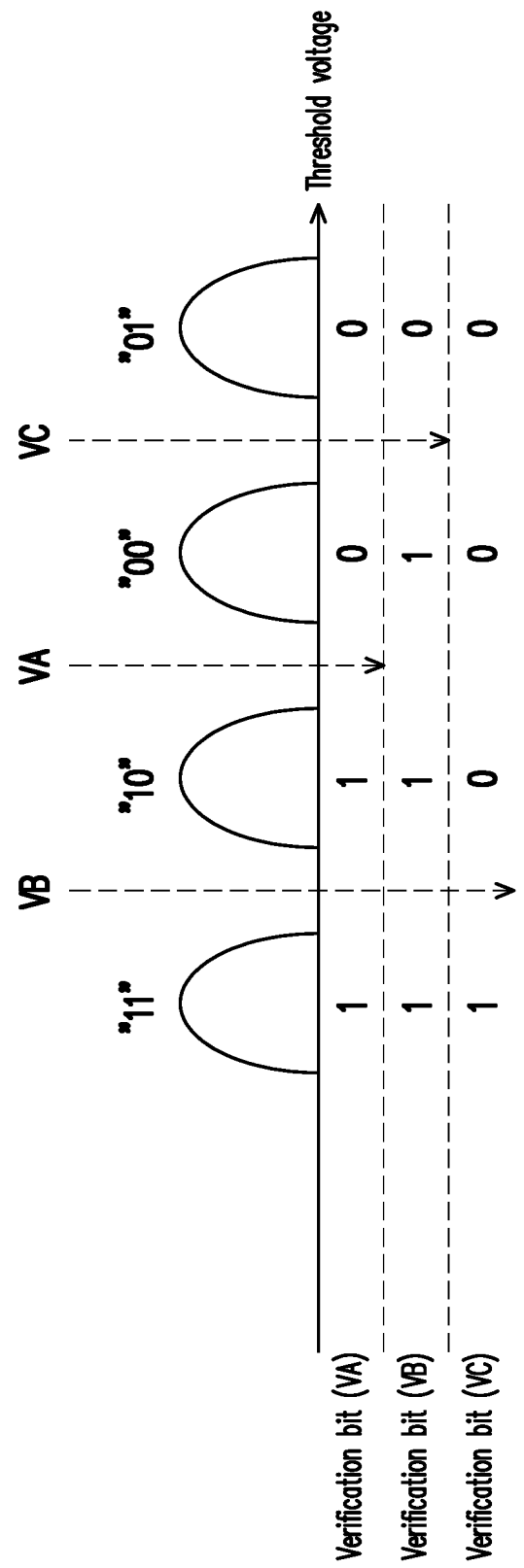
FIG. 8 illustrates a schematic diagram of reading data from a memory cell according to an exemplary embodiment.

FIG. 8 illustrates a schematic diagram for reading data from a memory cell according to an exemplary embodiment, in which a MLC NAND flash memory is used as an example.

Referring to FIG. 8, in a reading operation for the memory cells of the memory cell array 2202, read voltages VA to VC are applied to the control gate, and data stored in the memory cells are identified according whether the channel of the memory cell is turned on. A verification bit (VA) is configured to indicate whether the channel of the memory cell is turned on when a read voltage VA is applied; a verification bit (VC) is configured to indicate whether the channel of the memory cell is turned on when a read voltage VC is applied; and a verification bit (VB) is configured to indicate whether the channel of the memory cell is turned on when a read voltage VB is applied. Here, it is assumed that the corresponding memory cell channel is turned on when the verification bit is "1", and the corresponding memory cell channel is not turned on when the verification bit is "0". As shown in FIG. 8, the storage state of the memory cell may be determined according to the verification bits (VA) to (VC) so the bits stored can be obtained.

Figure 9:
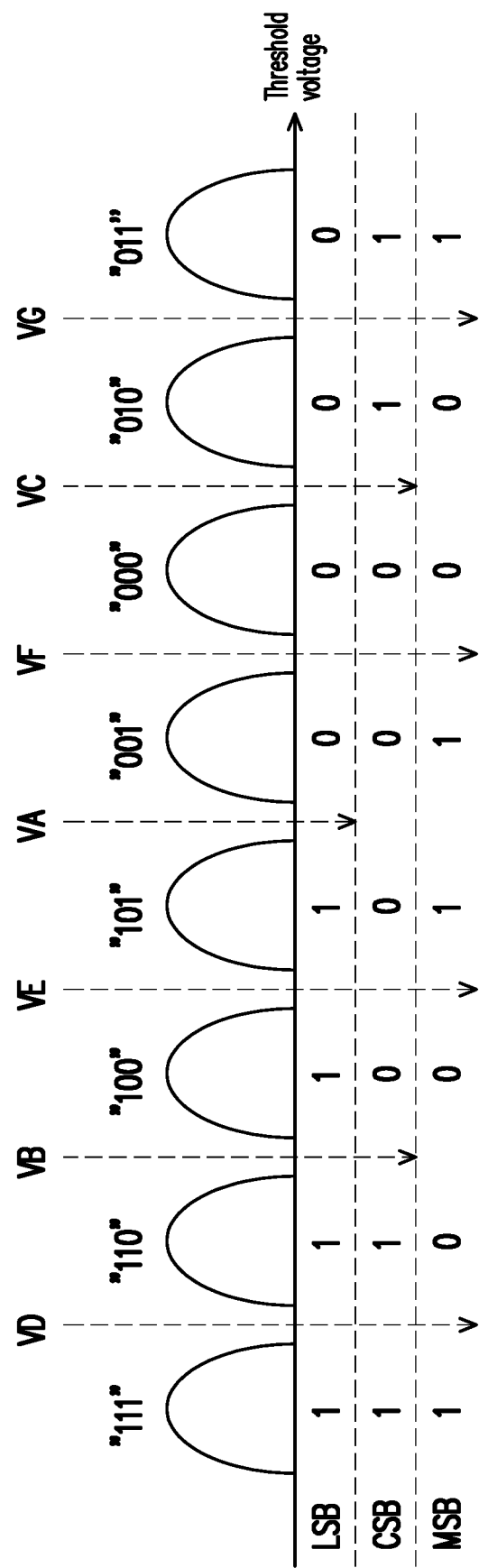
FIG. 9 illustrates a schematic diagram of reading data from a memory cell array according to another exemplary embodiment.

FIG. 9 illustrates a schematic diagram of reading data from a memory cell array according to another exemplary embodiment.

With reference to FIG. 9 that takes the TLC NAND flash memory for example, each of the storage states includes a first bit counted from the left being the least significant bit (LSB), a second bit counted from the left being a center significant bit (CSB) and a third bit counted from the left being the most significant bit (MSB). In this embodiment, the memory cell includes eight storage states depending on different threshold voltages (i.e., "111", "110", "100", "101", "001", "000", "010" and "011"). The bits stored in the memory cell may be identified by applying the read voltages VA to VC to the control gate.

Here, it should be noted that, an arranging sequence of the eight storage states in FIG. 9 may be decided based on manufacturer designs instead of being limited by the arranging sequence of this embodiment.

In addition, the memory cells of the rewritable non-volatile memory module 406 constitute a plurality of physical programming units, and the physical programming units constitute a plurality of physical erasing units. Specifically, the memory cells on the same word line in FIG. 6 constitute one or more of the physical programming units. For example, if the rewritable non-volatile memory module 406 is the MLC NAND flash memory module, the memory cells on intersections between the same word line and the bit lines constitute 2 physical programming units, i.e., the upper physical programming unit and the lower physical programming unit. In this case, one upper physical programming unit and one lower physical programming unit may be collectively referred to as a physical programming unit group. In particular, if data to be read is located in a lower physical programming unit of a physical programming unit group, the read voltage VA in FIG. 8 may be adopted to identify each bit value in the lower physical programming unit. If data to be read is located in an upper physical programming unit of a physical programming unit group, the read voltage VB and the read voltage VC in FIG. 8 may be adopted to identify each bit value in the upper physical programming unit.

Alternatively, if the rewritable non-volatile memory module 406 is the TLC NAND flash memory module, the memory cells on intersections between the same word line and the bit lines constitute 3 physical programming units, i.e., the upper physical programming unit, the middle physical programming unit and the lower physical programming unit. In this case, one upper physical programming unit, one middle physical programming unit and one lower physical programming unit may be collectively referred to as a physical programming unit group. In particular, if data to be read is located in a lower physical programming unit of a physical programming unit group, the read voltage VA in FIG. 9 may be adopted to identify each bit value in the lower physical programming unit. If data to be read is located in a middle physical programming unit of a physical programming unit group, the read voltage VB and the read voltage VC in FIG. 9 may be adopted to identify each bit value in the middle physical programming unit. If data to be read is located in an upper physical programming unit of a physical programming unit group, the read voltage VD, the read voltage VE and the read voltage VF and the read voltage VG in FIG. 9 may be adopted to identify each bit value in the upper physical programming unit.

In the present exemplary embodiment, the physical programming unit is the minimum unit for programming. That is, the physical programming unit is the minimum unit for writing data. For example, the physical programming unit is a physical page or a physical sector. If the physical programming unit is the physical page, these physical programming units usually include a data bit area and a redundancy bit area. The data bit area includes multiple physical sectors configured to store user data, and the redundant bit area is configured to store system data (e.g., an error correcting code). In this exemplary embodiment, the data bit area contains 32 physical sectors, and a size of each physical sector is 512 bytes (B). However, in other exemplary embodiments, the data bit area may also include 8, 16 physical sectors or different number (more or less) of the physical sectors, and the size of each physical sector may also be greater or smaller. On the other hand, the physical erasing unit is the minimum unit for erasing. Namely, each physical erasing unit contains the least number of memory cells to be erased together. For instance, the physical erasing unit is a physical block.

FIG. 10 is a schematic diagram illustrating management of physical erasing units according to an exemplary embodiment.

With reference to FIG. 10, in the present exemplary embodiment, it is assumed that one physical erasing unit is constituted by a plurality of physical programming unit groups. Each of the physical programming unit groups includes the lower physical programming unit, the middle physical programming unit and the upper physical programming unit constituted by multiple memory cells arranged on the same word line. For example, in the physical erasing unit, the 0-th physical programming unit belonging to the lower physical programming unit, the 1-st physical programming unit belonging to the center physical erasing unit and the 2-nd physical programming unit belonging to the upper physical programming unit are regarded as one physical programming unit group. Similarly, the 3-rd, the 4-th, and the 5-th physical programming units are regarded as one physical programming unit group, and by analogy, the other physical programming units are also grouped into multiple physical programming unit groups by the same method.

Figure 11:
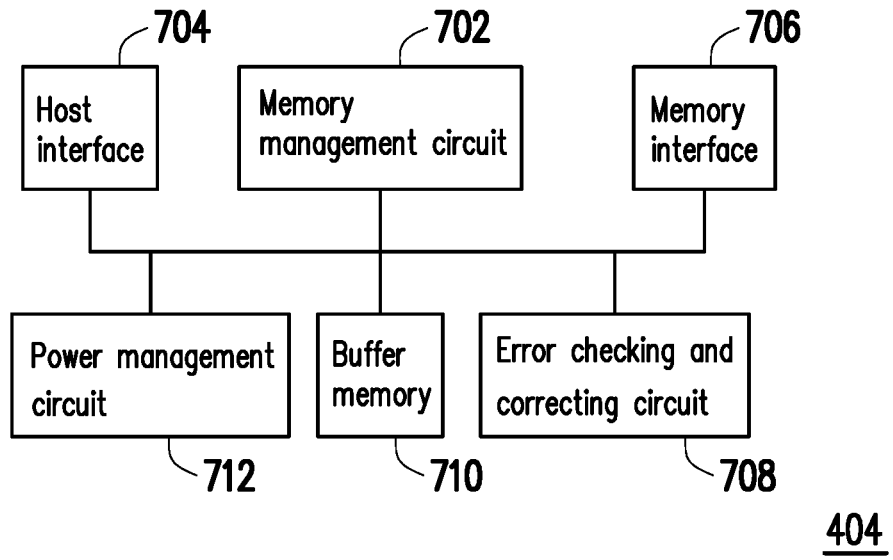
FIG. 11 is a schematic block diagram illustrating a memory controlling circuit unit according to an exemplary embodiment of the invention.

FIG. 11 is a schematic block diagram illustrating a memory controlling circuit unit according to an exemplary embodiment of the invention.

Referring to FIG. 11, the memory controlling circuit unit 404 includes a memory management circuit 702, a host interface 704, a memory interface 706 and an error check and correction circuit 708.

The memory management circuit 702 is configured to control overall operations of the memory controlling circuit unit 404. Specifically, the memory management circuit 702 has a plurality of control commands. When the memory storage device 10 operates, the control commands are executed to perform various operations such as data writing, data reading and data erasing. Hereinafter, description regarding operations of the memory management circuit 702 or any circuit element in the memory controlling circuit unit 404 is equivalent to description regarding operations of the memory controlling circuit unit 404.

In this exemplary embodiment, the control commands of the memory management circuit 702 are implemented in form of firmware. For instance, the memory management circuit 702 has a microprocessor unit (not illustrated) and a ROM (not illustrated), and the control commands are burned into the ROM. When the memory storage device 10 operates, the control commands are executed by the microprocessor to perform operations of writing, reading or erasing data.

In another exemplary embodiment, the control commands of the memory management circuit 702 may also be stored as program codes in a specific area (for example, the system area in a memory exclusively used for storing system data) of the rewritable non-volatile memory module 406. In addition, the memory management circuit 702 has a microprocessor unit (not illustrated), the read only memory (not illustrated) and a random access memory (not illustrated). More particularly, the ROM has a boot code, which is executed by the microprocessor unit to load the control commands stored in the rewritable non-volatile memory module 406 to the RAM of the memory management circuit 702 when the memory controlling circuit unit 404 is enabled. Then, the control commands are executed by the microprocessor unit to perform operations, such as writing, reading or erasing data.

Further, in another exemplary embodiment, the control commands of the memory management circuit 702 may also be implemented in form of hardware. For example, the memory management circuit 702 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory cell management circuit is configured to manage the memory cells of the rewritable non-volatile memory module 406 or a group thereof. The memory writing circuit is configured to give a write command sequence for the rewritable non-volatile memory module 406 in order to write data into the rewritable non-volatile memory module 406. The memory reading circuit is configured to give a read command sequence for the rewritable non-volatile memory module 406 in order to read data from the rewritable non-volatile memory module 406. The memory erasing circuit is configured to give an erase command sequence for the rewritable non-volatile memory module 406 in order to erase data from the rewritable non-volatile memory module 406. The data processing circuit is configured to process both the data to be written into the rewritable non-volatile memory module 406 and the data read from the rewritable non-volatile memory module 406. Each of the write command sequence, the read command sequence and the erase command sequence may include one or more program codes or command codes, and instruct the rewritable non-volatile memory module 406 to perform the corresponding operations, such as writing, reading and erasing. In an exemplary embodiment, the memory management circuit 702 may further give command sequence of other types to the rewritable non-volatile memory module 406 for instructing to perform the corresponding operations.

The host interface 704 is coupled to the memory management circuit 702 and configured to receive and identify commands and data sent from the host system 11. In other words, the commands and data transmitted by the host system 11 are transmitted to the memory management circuit 702 via the host interface 704. In this exemplary embodiment, the host interface 704 is compatible with the SATA standard. Nevertheless, it should be understood that the invention is not limited in this regard. The host interface 704 may also compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other suitable standards for data transmission.

The memory interface 706 is coupled to the memory management circuit 702 and configured to access the rewritable non-volatile memory module 406. In other words, data to be written into the rewritable non-volatile memory module 406 is converted into a format acceptable by the rewritable non-volatile memory module 406 via the memory interface 706. Specifically, if the memory management circuit 702 intends to access the rewritable non-volatile memory module 406, the memory interface 706 sends corresponding command sequences. For example, the command sequences may include the write command sequence as an instruction for writing data, the read command sequence as an instruction for reading data, the erase command sequence as an instruction for erasing data, and other corresponding command sequences as instructions for performing various memory operations (e.g., changing read voltage levels or performing a garbage collection procedure). These command sequences are generated by the memory management circuit 702 and transmitted to the rewritable non-volatile memory module 406 through the memory interface 706, for example. The command sequences may include one or more signals, or data transmitted in the bus. The signals or the data may include command codes and program codes. For example, information such as identification codes and memory addresses are included in the read command sequence.

The error check and correction circuit 708 is coupled to the memory management circuit 702 and configured to perform an error check and correction operation to ensure integrity of data. Specifically, when the memory management circuit 702 receives the write command from the host system 11, the error check and correction circuit 708 generates an ECC (error correcting code) and/or an EDC (error detecting code) for data corresponding to the write command, and the memory management circuit 702 writes data and the ECC and/or the EDC corresponding to the write command into the rewritable non-volatile memory module 406. Later, when reading the data from the rewritable non-volatile memory module 406, the memory management circuit 702 will read the corresponding ECC and/or the EDC, and the error check and correction circuit 708 will perform the error check and correction operation on the read data based on the ECC and/or the EDC.

In an exemplary embodiment, the memory controlling circuit unit 404 further includes a buffer memory 710 and a power management circuit 712.

The buffer memory 710 is coupled to the memory management circuit 702 and configured to temporarily store data and commands from the host system 11 or data from the rewritable non-volatile memory module 406. The power management unit 712 is coupled to the memory management circuit 702 and configured to control a power of the memory storage device 10.

In this exemplary embodiment, the error check and correction circuit 708 can perform a single-frame encoding for the data stored in the same physical programming unit and can also perform a multi-frame encoding for data stored in multiple physical programming units. Each of the single-frame encoding and the multi-frame encoding may adopt encoding algorithms including at least one of a LDPC (low density parity code), a BCH code, a convolutional code or a turbo code. Alternatively, in another exemplary embodiment, the multi-frame encoding may also include a RS codes (Reed-solomon codes) algorithm or an XOR (exclusive OR) algorithm. Further, in another exemplary embodiment, more of other encoding algorithms not listed above may also be adopted, which are omitted herein. According to the adopted encoding algorithm, the error check and correction circuit 708 can encode the data to be protected, so as to generate the corresponding ECC and/or the EDC. For descriptive convenience, the ECC and/or the EDC generated by encoding are collectively referred to as encoded data.

It is noted that in the following description, some terms may be replaced with corresponding abbreviations for ease of reading (see Table 1).

TABLE 1

| rewritable non-volatile memory module | RNVM module |
| --- | --- |
| physical programming unit | PPU |
| physical erasing unit | PEU |
| memory management circuit | MMC |

Figure 12:
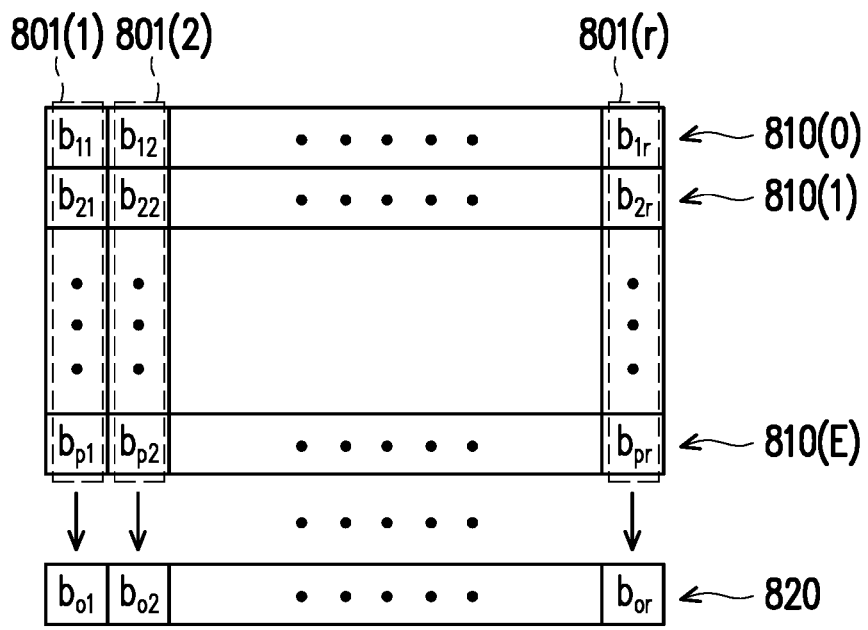
FIG. 12 is a schematic diagram illustrating a multi-frame encoding according to an exemplary embodiment of the invention.

FIG. 12 is a schematic diagram illustrating a multi-frame encoding according to an exemplary embodiment of the invention.

With reference to FIG. 12 that takes encoded data 820 correspondingly generated by encoding the data stored in PPUs 810(0) to 810(E) as an example, in which at least a part of data stored by each of the PPUs 810(0) to 810(E) may be regarded as one frame. In the multi-frame encoding, the data in the PPUs 810(0) to 810(E) are encoded based on each of positions where bits (or bytes) are located. For example, bits $b_{11}, b_{21}, \ldots, b_{p1}$ at a position 801(1) are encoded as a bit $b_{o1}$ in the encoded data 820 and bits $b_{12}, b_{22}, \ldots, b_{p2}$ at a position 801(2) are encoded as a bit $b_{o2}$ in the encoded data 820; and by analogy, bits $b_{1r}, b_{2r}, \ldots, b_{pr}$ at a position 801(r) are encoded as a bit $b_{or}$ in the encoded data 820. Later, the data read from the PPUs 810(0) to 810(E) may be decoded according to the encoded data 820 so attempts on correcting possible errors in the read data can be made.

Herein, in another exemplary embodiment of FIG. 12, the data used for generating the encoded data 820 may also include redundancy bits corresponding to the data bits in the data stored in the PPUs 810(0) to 810(E). Taking the data stored in the PPU 810(0) for example, the redundancy bits therein are, for example, generated by performing the single-frame encoding for the data bits stored in the PPU 810(0). In this exemplary embodiment, it is assumed that when the data of the PPU 810(0) is read, the data read from the PPU 810(0) may be decoded by the redundancy bits (e.g., the encoded data of the single-frame encoding) in the PPU 810(0) so as to perform the error check and correct operation. However, if a failure occurs when a decoding operation is performed by using the redundancy bits in the PPU 810(0) (e.g., a number of error bits of the data stored in the PPU 810(0) is greater than a threshold), a retry-read mechanism may be used to attempt reading correct data from the PPU 810(0). Details regarding the retry-read mechanism would be described later. When the correct data cannot be read from the PPU 810(0) by using the retry-read mechanism, the encoded data 820 and data of the PPUs 810(1) to 810(E) may be read and the decoding may be performed according to the encoded data 820 and the data of the PPUs 810(1) to 810(E) so as to attempt correcting errors included in the data stored in the PPU 810(0). In other words, in the present exemplary embodiment, if a failure occurs when the decoding is performed by using the encoded data generated by the single-frame encoding and a failure occurs when the reading is performed by using the retry-read mechanism, the encoded data generated by the multi-frame encoding is used for the decoding instead.

Figure 13:
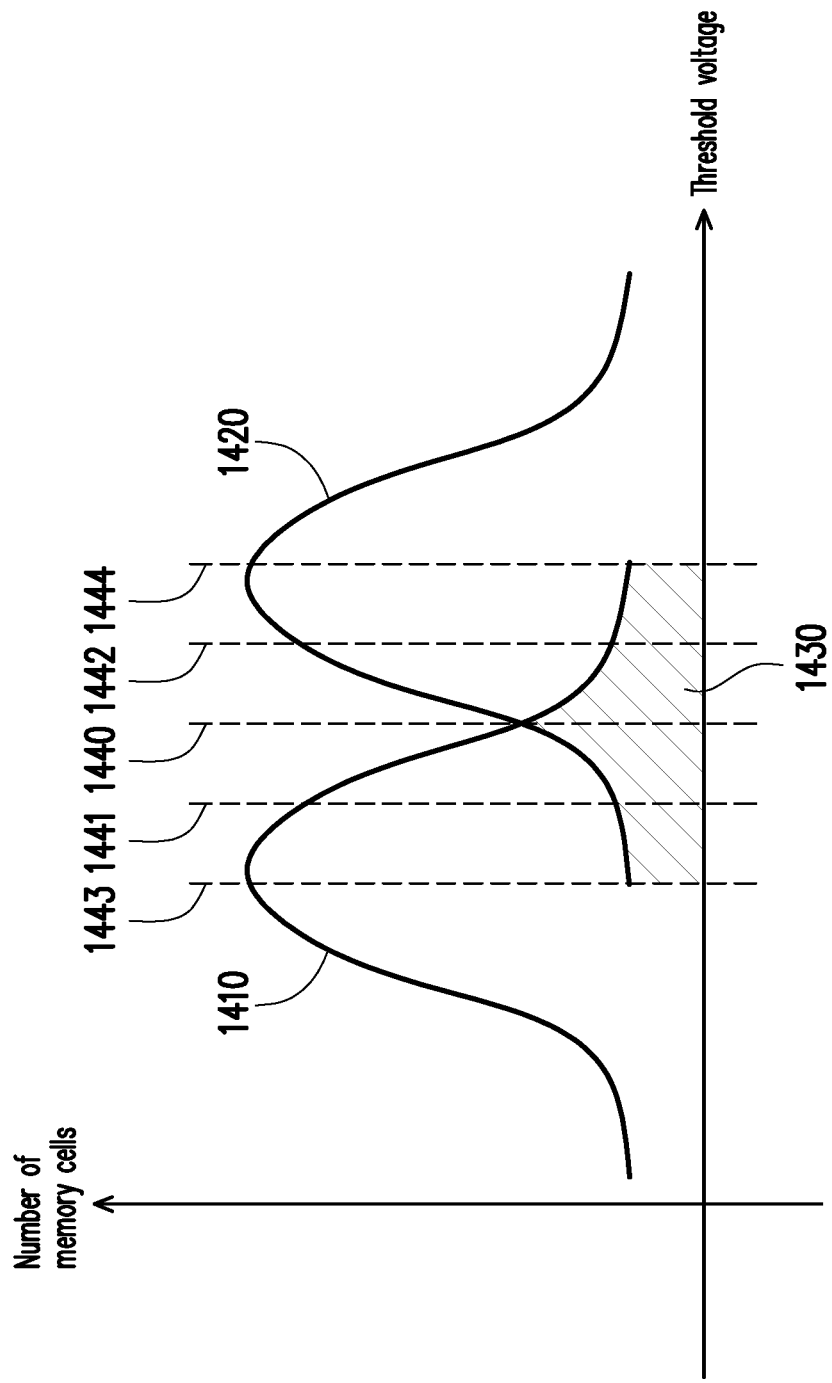
FIG. 13 is a schematic diagram illustrating a retry-read mechanism according to an exemplary embodiment.

In particular, FIG. 13 is a schematic diagram illustrating a retry-read mechanism according to an exemplary embodiment.

With reference to FIG. 13 in which the SLC flash memory is taken as an example, a distribution 1410 and a distribution 1420 are used to indicate the storage states of a plurality of first memory cells, and the distributions 1410 and 1420 respectively indicate different storage states. These first memory cells may belong to the same PPU or different PPUs, and the invention is not limited thereto. Here, it is assumed that when one memory cell belongs to the distribution 1410, and what stored by that memory cell is the bit "1"; and when one memory cell belongs to the distribution 1420, what stored by that memory cell is the bit "0". When the MMC 702 uses a read voltage 1440 to read the memory cell, the MMC 702 would obtain a verification bit, which is used to indicate whether that memory cell is turned on. Here, it is assumed that the verification bit is "1" when the memory cell is turned on, otherwise it is "0", but the invention is not limited thereto. If the verification bit is "1", the MMC 702 determines that this memory cell belongs to distribution 1410, and otherwise, determines that it belongs to the distribution 1420. The distribution 1410 and the distribution 1420 overlap with each other in a region 1430. In other words, there exit several memory cells that should belong to the distribution 1410 but identified as belonging to the distribution 1420 as well as several memory cells that should belong to the distributions 1420 but identified as belonging to the distribution 1410.

In this exemplary embodiment, when reading those memory cells, the MMC 702 would select a preset read voltage (e.g., a read voltage 1441) for reading the memory cells to obtain the verification bits of those memory cells. The error check and correction circuit 708 would perform the decoding operation according to the verification bits of those memory cells so as to generate a plurality of decoded bits. These decoded bits can compose one decoded data (a.k.a. codeword).

If the decoding operation is failed, it means that there are uncorrectable error bits stored in these memory cells. If the decoding operation is failed, in the retry-read mechanism, the MMC 702 would re-obtain another read voltage, and use said another read voltage (e.g., a read voltage 1442) to read the first memory cells, so as to obtain the verification bits of the memory cells. The MMC 702 performs the same decoding operation according to re-obtained verification bits to obtain another decoded data composed of a plurality of decoded bits. In an exemplary embodiment, the error check and correction circuit 708 would determine whether another decoded data is a valid codeword according to a syndrome corresponding to said another decoded data. If said another decoded data is not the valid codeword, the MMC 702 would determine that the decoding operation is failed. If the number of times the read voltage is re-obtained does not exceed a preset number of times, the MMC 702 would re-obtain other read voltages (e.g., a read voltage 1443), and reads the memory cells according to the re-obtained read voltage 1443 to re-obtain the verification bits and perform the decoding operation.

In other words, when there are uncorrectable error bits, by re-obtaining the read voltage, the verification bits of certain memory cells would be changed so there is an opportunity to change a decoding result of the decoding operation. Logically speaking, the action of re-obtaining the read voltage is to flip several bits in one codeword and re-decode the new codeword. In certain cases, the codeword that cannot be decoded before the flipping (with the uncorrectable error bits) may be decoded after the flipping. Also, in an exemplary embodiment, the MMC 702 would attempt the decoding several times until the number of attempts exceeds the preset number of times. Nevertheless, the invention is not intended to limit the preset number of times.

It should be noted that, although the SLC flash memory is used as the example in FIG. 13, the steps of re-obtaining the read voltage are also applicable to the MLC or TLC flash memories. As shown by FIG. 8, changing a read voltage VA would flip the LSB of one memory cell, and changing read voltage VB or VC would flip the MSB of one memory cell. Therefore, changing the read voltage VA, VB or VC can change one codeword to another codeword. The result of changing the codeword is also applicable to the TLC flash memory of FIG. 9. The invention is not limited to the use of SLC, MLC or TLC flash memory.

With the retry-read mechanism described above, an optimal read voltage for reading a plurality of memory cells on the same word line may be located, and this optimal read voltage may be used to read data in said memory cells and successfully decode the data. In particular, the optimal read voltage can usually make a quantity of the memory cells that should belongs to the distribution 1410 but identified as belonging to the distribution 1420 equal to a quantity of the memory cells that should belong to the distribution 1420 but identified as belonging to the distribution 1410. The optimal read voltage is, for example, the read voltage 1440 in FIG. 13. The operation of finding optimal read voltage for reading the memory cells may be performed when the read voltage 406 is idle (or also known as in a background time), and the determined optimal read voltage may be used later to read the RNVM module 406. Nonetheless, it should be noted that, the optimal read voltage for reading the memory cells on one word line may not be suitable for reading the memory cells on another word line. In other words, the optimal read voltage for reading the memory cells on one word line may not be the optimal read voltage for reading the memory cells on another word line. An order of using a plurality of retry-read voltages when determining the optimal read voltage for reading the memory cells on one word line may not be suitable for determining the optimal read voltage for reading the memory cells on another word line. Therefore, the process for determining the optimal read voltage would normally reduce the performance of the MMC 702.

Based on the above, the voltage adjusting method proposed by the invention can effectively calculate the optimal read voltage for reading the memory cells in the subsequent reading operation. Accordingly, the probability of successful decoding may be increased and the number of retry-reads may be reduced so as to effectively improve the performance of the MMC 702.

The voltage adjusting method of the invention is described below with reference to multiple embodiments.

First Embodiment

Figure 14B:
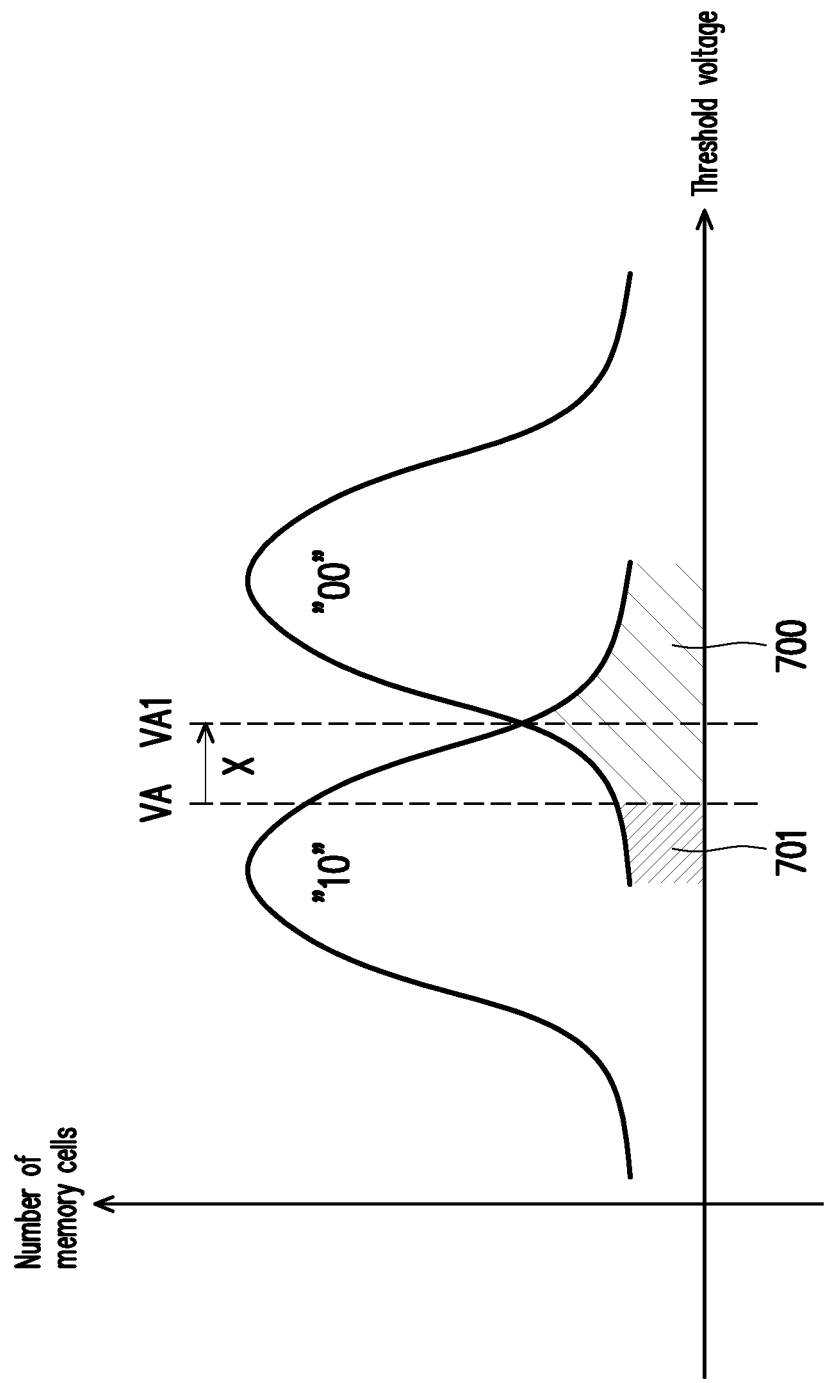

The MLC NAND flash memory is taken as an example in the first exemplary embodiment. As shown by FIG. 8, based on different threshold voltages, each memory cell has four storage states, and these storage states represent "11", "10", "00" and "01", respectively. In FIG. 8, the MMC 702 uses the read voltage VA to distinguish the storage states "10" and "00". The exemplary embodiments of FIG. 14A to FIG. 14C are mainly used for adjusting the read voltage VA to an optimal read voltage. However, the invention is not limited in this regard. In other embodiments, the same method may also be applicable to adjust the read voltage VB and the read voltage VC in FIG. 8 to the optimal voltage.

FIG. 14A to FIG. 14C are schematic diagrams illustrating how the read voltage is adjusted according to a first exemplary embodiment.

Referring to FIG. 14A and FIG. 14B together, it is assumed that the RNVM module 406 includes a PPU group G1, as shown by a table T1 in FIG. 14A. The PPU group G1 (a.k.a. a first PPU group) has a lower PPU LP1 and an upper PPU UP1. The PPU G1 is composed of memory cells C1 to C8 (a.k.a. the first memory cells) on the same word line (a.k.a. a first word line). The LSBs of the memory cells C1 to C8 can compose the lower PPU LP1, and the MSBs of the memory cells C1 to C8 can compose the upper PPU UP1.

In this exemplary embodiment, the MMC 702 first reads the lower PPU LP1 (a.k.a. a first PPU) in the PPU group G1 to obtain first data. As shown by the table T1, a value of the first data read from the lower PPU LP1 is "11100000".

The MMC 702 can correct the first data according to an error check and correction code (a.k.a. a first check and correction code) corresponding to the first data to obtain first corrected data (not illustrated). A value of the first corrected data is, for example, "01010111". It should be noted that, the first check and correction code is, for example, encoded data generated by performing the single-frame encoding on the lower PPU LP1.

In addition, the MMC 702 also reads the upper PPU UP1 (a.k.a. a second PPU) in the PPU group G1 to obtain second data. As shown by the table T1, a value of the second data read from the upper PPU UP1 is "00100010". Afterwards, the MMC 702 adjusts the read voltage VA (a.k.a. a first read voltage) for reading the memory cell C1 to C8 to a read voltage VA1 (a.k.a. a second read voltage) according to the first data, the first corrected data and the second data. Particularly, in this exemplary embodiment, the adjusted read voltage VA1 is the optimal read voltage used for distinguishing the storage states "10" and "00".

More specifically, in the process of adjusting the read voltage VA to the read voltage VA1, first, the MMC 702 performs an exclusive OR (XOR) operation on the first data and the first corrected data to obtain XOR data LX1 (a.k.a. a third data). As shown by the table T1, a value of the XOR data LX1 is, for example, "10110111". In particular, the XOR data LX1 has eight bits, and each of the bits corresponds to one memory cell. For example, the first bit of the XOR data LX1 corresponds to the memory cell C1, and the current storage state of the memory cell C1 is "10"; the second bit of the XOR data LX1 corresponds to the memory cell C2, and the current storage state of the memory cell C2 is "10"; the third bit of the XOR data LX1 corresponds to the memory cell C3, and the current storage state of the memory cell C3 is "11"; and the rest may be deduced by analogy.

In the XOR data LX1, when the value of one bit is "1", it means that the storage state of the memory cell corresponding to the value of that bit is located in an error interval in a storage state distribution map. More specifically, referring to FIG. 14A and FIG. 14B together, with the first bit of the XOR data LX1 taken as an example, because the value of the first bit of the XOR data LX1 is "1", it means that the memory cell C1 actually belongs an error interval 701 (a.k.a. a first error interval) in FIG. 14B. Here, the memory cell C1 located in the error interval 701 belongs to the storage state "00" (a.k.a. a second storage state), and yet the memory cell C1 is identified as belonging to the storage state "10" (a.k.a. a first storage state) according to the read voltage VA. As another example, with the fourth, the sixth and the eighth bits of the XOR data LX1 taken as an example, because the values of the fourth, the sixth and the eighth bits of the XOR data LX1 are "1", it means that the memory cell C4, the memory cell C6 and the memory cell C8 belong to an error interval 700 (a.k.a. a second error interval) in FIG. 14B. Here, the memory cells C4, C6 and C8 located in the error interval 701 actually belong to the storage state "10", and yet the memory cells C4, C6 and C8 are identified as belonging to the storage state "00" according to the read voltage VA. Here, the memory cell C1 may also be referred to as "a second memory cell", and the memory cell C4, C6 and C8 may be collectively referred to as "a third memory cell".

In addition, since the values of the second and the fifth bits of the XOR data LX1 are "0", it means that the memory cells C2 and C5 are not located in the error interval. In other words, the storage state of the memory cell not located in the error interval is correctly identified according to the read voltage. Since the value of the third bit of the XOR data LX1 is "1", it means that the memory cell C3 belongs to one specific error interval in the storage state distribution map of FIG. 8.

Here, in the example of adjusting the read voltage VA for distinguishing the storage states "10" and "00" to the optimal read voltage VA1, the MMC 702 first calculates a quantity (a.k.a. a first quantity) of the second memory cell located in the error interval 701. Here, since the second memory cell includes only the memory cell C1, the first quantity is "1".

The MMC 702 also calculates a quantity (a.k.a. a second quantity) of the third memory cell located in the error interval 700. Here, since the third memory cell includes the memory cells C4, C6 and C8, the second quantity is "3".

Next, the MMC 702 adjusts the read voltage VA to the read voltage VA1 according to the first quantity and the second quantity. More specifically, in the exemplary embodiment of FIG. 14A and FIG. 14B, the first quantity (with the value of "1") is less than the second quantity (with the value of "3"). In view of the storage state distribution map of FIG. 14B, the first quantity may be regarded as an area of the error interval 701 and the second quantity may be regarded as an area of the error interval 700. The MMC 702 adjusts the read voltage VA to the read voltage VA1 with the read voltage VA1 greater than the read voltage VA according to the first quantity and the second quantity (or the area of the error interval 701 and the area of the error interval 700). The read voltage VA1 and the read voltage VA may be X volt apart. In particular, later when the MMC 702 uses the read voltage VA1 to read the memory cells C1 to C8, the quantity of the memory cells located in the error interval 701 (e.g., "2") would be identical to the quantity of the memory cells located in the error interval 700 (e.g., "2"). In other words, if one read voltage is located between two error intervals and the quantities of the memory cells in the two error intervals are identical when the read voltage is used to read the memory cells, it means that the read voltage is the optimal read voltage. Accordingly, the data read by using the optimal read voltage can have a higher probability of successful decoding.

It should be noted that, an amplitude for adjusting the read voltage is determined according to a ratio of the first quantity and the second quantity (i.e., said X volt) in this invention. For instance, the MMC 702 can, for example, pre-store multiple ratios of the first quantity and the second quantity and a lookup table including the amplitude for adjusting the read voltage corresponding to the ratios. When using the read voltage VA to obtain the first quantity and the second quantity, the MMC 702 can obtain the amplitude for adjusting the read voltage (i.e., said X volt) from the lookup table. In this exemplary embodiment, with use of the lookup table, when the first quantity is less than the second quantity, the read voltage VA may be adjusted to the read voltage VA1 that is greater than the read voltage VA; and when the first quantity is greater than the second quantity, the read voltage VA may be adjusted to the read voltage VA1 that is less than the read voltage VA.

However, the invention is not limited in this regard. In other embodiments, instead of using the lookup table, the MMC 702 may also directly adjust the read voltage VA to another read voltage VA1 greater than the read voltage VA when the first quantity is less than the second quantity; and directly adjust the read voltage VA to another read voltage VA1 less than the read voltage VA when the first quantity is greater than the second quantity.

Further, FIG. 14C illustrates a situation where the first quantity is greater than the second quantity using another example.

In detail, with reference to FIG. 14C, it is assumed that the first quantity (e.g., with the value of "3") calculated by using aforesaid method is greater than the second quantity (e.g., with the value of "1"). In view of the storage state distribution map of FIG. 14C, the area of the error interval 701 is greater than the area of the error interval 700. Accordingly, the MMC 702 adjusts the read voltage VA to the read voltage VA1 with the read voltage VA1 less than the read voltage VA according to the first quantity and the second quantity (or the area of the error interval 701 and the area of the error interval 700). The read voltage VA1 and the read voltage VA may be X volt apart. In particular, later when the MMC 702 uses the read voltage VA1 to read the memory cells C1 to C8, the quantity of the memory cells located in the error interval 701 (e.g., "2") would be identical to the quantity of the memory cells located in the error interval 700 (e.g., "2").

After determining the optimal read voltage VA1, the MMC 702 can record the read voltage VA1. Later, when the MMC 702 intends to read the memory cells C1 to C8, the MMC 702 can use the read voltage VA1 to read the memory cells C1 to C8 to identify the storage states "10" and "00" instead of the using the read voltage VA.

In particular, although the example above is used for adjusting the read voltage VA in FIG. 8, the invention is not limited thereto. In other embodiments, the MMC 702 can also adjust the read voltage for distinguishing the storage states "11" and "10" to an optimal read voltage, or adjust the read voltage for distinguishing the storage states "00" and "01" to an optimal read voltage. For instance, as similar to the examples of FIG. 14A to FIG. 14C, the MMC 702 can, for example, correct the second data according to a second error check and correction code (not illustrated) corresponding to the second data the upper PPU UP1 to obtain second corrected data (not illustrated). Afterwards, the MMC 702 adjusts the read voltage VB or VC (collectively referred to as a third read voltage) for reading the memory cells C1 to C8 in FIG. 8 to an optimal read voltage (hereinafter referred to as a fourth read voltage) according to the first data, the second data and the second corrected data. After determining the fourth read voltage, the MMC 702 can record the fourth read voltage. Later, when the MMC 702 intends to read the memory cells C1 to C8, the MMC 702 can use the fourth read voltage to read the memory cells C1 to C8, so as to identify the storage states "11" and "10" (or the storage states "00" and "01").

Second Embodiment

Figure 15C:
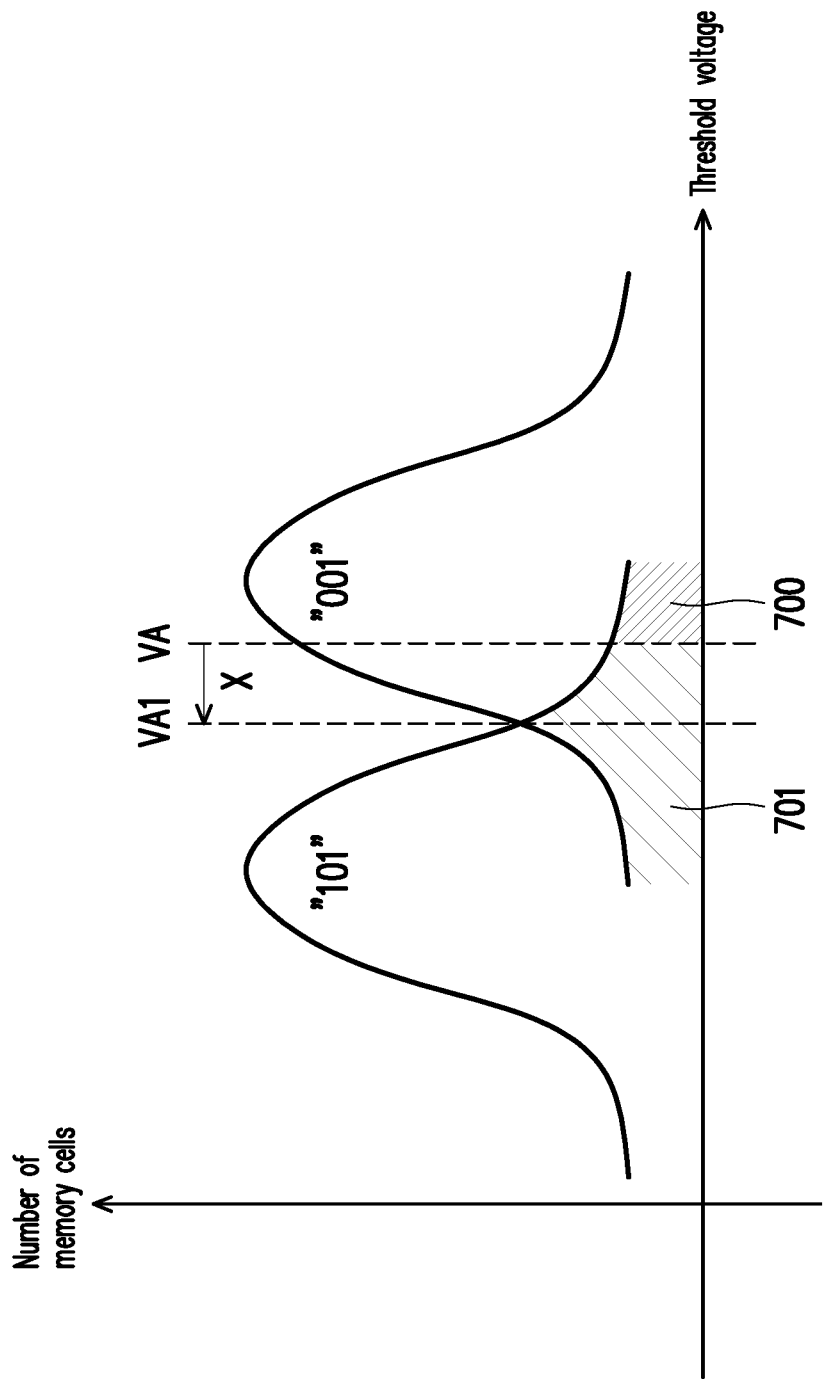

The TLC NAND flash memory is taken as an example in the second exemplary embodiment. As shown by FIG. 9, based on different threshold voltages, each memory cell has eight storage states, and these storage states represent "111", "110", "100", "101", "001", "000", "010" and "011", respectively. In FIG. 9, the MMC 702 uses the read voltage VA to distinguish the storage states "101" and "001". The exemplary embodiments of FIG. 15A to FIG. 15C are mainly used for adjusting the read voltage VA to an optimal read voltage. However, the invention is not limited in this regard. In other embodiments, the same method may also be applicable to adjust the read voltages VB to VG in FIG. 9 to the optimal voltage.

FIG. 15A to FIG. 15C are schematic diagrams illustrating how the read voltage is adjusted according to a second exemplary embodiment.

Referring to FIG. 15A and FIG. 15B together, it is assumed that the RNVM module 406 includes a PPU group G2, as shown by a table T2 in FIG. 15A. The PPU group G2 (a.k.a. a first PPU group) has a lower PPU LP2, a middle PPU MP2 and an upper PPU UP2. The PPU G2 is composed of memory cells C1 to C8 (a.k.a. the first memory cells) on the same word line (a.k.a. the first word line). The LSBs of the memory cells C1 to C8 can compose the lower PPU LP2, the CSBs of the memory cells C1 to C8 can compose the middle PPU MP2, and the MSBs of the memory cells C1 to C8 can compose the upper PPU UP2.

In this exemplary embodiment, the MMC 702 first reads the lower PPU LP2 (a.k.a. a first PPU) in the PPU group G2 to obtain first data. As shown by the table T2, a value of the first data read from the lower PPU LP2 is "11101000".

The MMC 702 can correct the first data according to an error check and correction code (a.k.a. a first check and correction code) corresponding to the first data to obtain first corrected data (not illustrated). A value of the first corrected data is, for example, "01011111". It should be noted that, the first check and correction code is, for example, encoded data generated by performing the single-frame encoding on the lower PPU LP2.

In addition, the MMC 702 also reads the middle PPU MP2 and the upper PPU UP2 (collectively referred to as a second PPU) in the PPU group G2 to obtain second data stored in these PPUs. As shown by the table T2, a value of the data read from the middle PPU MP2 is, for example, "00100000", and a value of the data read from the upper PPU UP2 is, for example, "10011101". Afterwards, the MMC 702 adjusts the read voltage VA (a.k.a. a first read voltage) for reading the memory cell C1 to C8 to a read voltage VA1 (a.k.a. a second read voltage) according to the first data, the first corrected data and the second data. Particularly, in this exemplary embodiment, the adjusted read voltage VA1 is the optimal read voltage used for distinguishing the storage states "101" and "001".

More specifically, in the process of adjusting the read voltage VA to the read voltage VA1, first, the MMC 702 performs an exclusive OR (XOR) operation on the first data and the first corrected data to obtain XOR data LX2 (a.k.a. third data). As shown by the table T2, a value of the XOR data LX2 is, for example, "10110111".

In the XOR data LX2, when the value of one bit is "1", it means that the storage state of the memory cell corresponding to the value of that bit is located in an error interval in a storage state distribution map. More specifically, referring to FIG. 15A and FIG. 15B together, with the first bit of the XOR data LX2 taken as an example, because the value of the first bit of the XOR data LX2 is "1", it means that the memory cell C1 actually belongs an error interval 701 (a.k.a. a first error interval) in FIG. 15B. Here, the memory cell C1 located in the error interval 701 belongs to the storage state "001" (a.k.a. a second storage state), and yet the memory cell C1 is identified as belonging to the storage state "101" (a.k.a. a first storage state) according to the read voltage VA. As another example, with the fourth, the sixth and the eighth bits of the XOR data LX2 taken as an example, because the values of the fourth, the sixth and the eighth bits of the XOR data LX2 are "1", it means that the memory cells C4, C6 and C8 belong to an error interval 700 (a.k.a. a second error interval) in FIG. 15B. Here, the memory cells C4, C6 and C8 located in the error interval 700 actually belong to the storage state "101", and yet the memory cells C4, C6 and C8 are identified as belonging to the storage state "001" according to the read voltage VA. Here, the memory cell C1 may also be referred to as "a second memory cell", and the memory cells C4, C6 and C8 may be collectively referred to as "a third memory cell".

In addition, since the values of the second and the fifth bits of the XOR data LX2 are "0", it means that the memory cells C2 and C5 are not located in the error interval. In other words, the storage state of the memory cell not located in the error interval is correctly identified according to the read voltage. Since the value of the third bit of the XOR data LX2 is "1", it means that the memory cell C3 belongs to one specific error interval in the storage state distribution map of FIG. 9.

Here, in the example of adjusting the read voltage VA for distinguishing the storage states "101" and "001" to the optimal read voltage VA1, the MMC 702 first calculates a quantity (a.k.a. a first quantity) of the second memory cell located in the error interval 701. Here, since the second memory cell includes only the memory cell C1, the first quantity is "1".

The MMC 702 also calculates a quantity (a.k.a. a second quantity) of the third memory cell located in the error interval 700. Here, since the third memory cell includes the memory cells C4, C6 and C8, the second quantity is "3".

Next, the MMC 702 adjusts the read voltage VA to the read voltage VA1 according to the first quantity and the second quantity. More specifically, in the exemplary embodiment of FIG. 15A and FIG. 15B, the first quantity (with the value of "1") is less than the second quantity (with the value of "3"). In view of the storage state distribution map of FIG. 15B, the first quantity may be regarded as an area of the error interval 701 and the second quantity may be regarded as an area of the error interval 700. The MMC 702 adjusts the read voltage VA to the read voltage VA1 with the read voltage VA1 greater than the read voltage VA according to the first quantity and the second quantity (or the area of the error interval 701 and the area of the error interval 700). The read voltage VA1 and the read voltage VA may be X volt apart. In particular, later when the MMC 702 uses the read voltage VA1 to read the memory cells C1 to C8, the quantity of the memory cells located in the error interval 701 (e.g., "2") would be identical to the quantity of the memory cells located in the error interval 700 (e.g., "2"). In other words, if one read voltage is located between two error intervals and the quantities of the memory cells in the two error intervals are identical when the read voltage is used to read the memory cells, it means that the read voltage is the optimal read voltage. Accordingly, the data read by using the optimal read voltage can have a higher probability of successful decoding.

It should be noted that, an amplitude for adjusting the read voltage is determined according to a ratio of the first quantity and the second quantity (i.e., said X volt) in this invention. For instance, the MMC 702 can, for example, pre-store multiple ratios of the first quantity and the second quantity and a lookup table including the amplitude for adjusting the read voltage corresponding to the ratios. When using the read voltage VA to obtain the first quantity and the second quantity, the MMC 702 can obtain the amplitude for adjusting the read voltage (i.e., said X volt) from the lookup table. In this exemplary embodiment, with use of the lookup table, when the first quantity is less than the second quantity, the read voltage VA may be adjusted to the read voltage VA1 that is greater than the read voltage VA; and when the first quantity is greater than the second quantity, the read voltage VA may be adjusted to the read voltage VA1 that is less than the read voltage VA.

However, the invention is not limited in this regard. In other embodiments, instead of using the lookup table, the MMC 702 may also directly adjust the read voltage VA to another read voltage VA1 greater than the read voltage VA when the first quantity is less than the second quantity; and directly adjust the read voltage VA to another read voltage VA1 less than the read voltage VA when the first quantity is greater than the second quantity.

Further, FIG. 15C illustrates a situation where the first quantity is greater than the second quantity using another example.

In detail, with reference to FIG. 15C, it is assumed that the first quantity (e.g., with the value of "3") calculated by using aforesaid method is greater than the second quantity (e.g., with the value of "1"). In view of the storage state distribution map of FIG. 15C, the area of the error interval 701 is greater than the area of the error interval 700. Accordingly, the MMC 702 adjusts the read voltage VA to the read voltage VA1 with the read voltage VA1 less than the read voltage VA according to the first quantity and the second quantity (or the area of the error interval 701 and the area of the error interval 700). The read voltage VA1 and the read voltage VA may be X volt apart. In particular, later when the MMC 702 uses the read voltage VA1 to read the memory cells C1 to C8, the quantity of the memory cells located in the error interval 701 (e.g., "2") would be identical to the quantity of the memory cells located in the error interval 700 (e.g., "2").

After determining the optimal read voltage VA1, the MMC 702 can record the read voltage VA1. Later, when the MMC 702 intends to read the memory cells C1 to C8, the MMC 702 can use the read voltage VA1 to read the memory cells C1 to C8 to identify the storage states "101" and "001" instead of the using the read voltage VA.

In particular, although the example above is used for adjusting the read voltage VA in FIG. 9, the invention is not limited thereto. In other embodiments, the MMC 702 can also adjust each of the read voltages VB to VG to the optimal read voltage. For instance, as similar to the examples of FIG. 15A to FIG. 15C, the MMC 702 can, for example, correct the data of the middle PPU MP2 according to the data corresponding to the middle PPU MP2 and an error check and correction code corresponding to the data (not illustrated) to obtain corrected data (not illustrated). Afterwards, the MMC 702 adjusts the read voltage VB or the read voltage VC for reading the memory cells C1 to C8 in FIG. 9 to the optimal read voltage according to the first data, the data of the middle PPU MP2, the data of the upper PPU UP2 and the corrected data of the data of the middle PPU MP2. Alternatively, the MMC 702 can, for example, correct the data of the upper PPU UP2 according to the data corresponding to the upper PPU UP2 and an error check and correction code corresponding to the data (not illustrated) to obtain corrected data (not illustrated). Afterwards, the MMC 702 can adjust the read voltage VD, the read voltage VE, the read voltage VF or the read voltage VG for reading the memory cells C1 to C5 to the optimal read voltages in FIG. 9 according to the first data, the data of the middle PPU MP2, the data of the upper PPU UP2 and the corrected data of the data of the upper PPU UP2.

Figure 16:
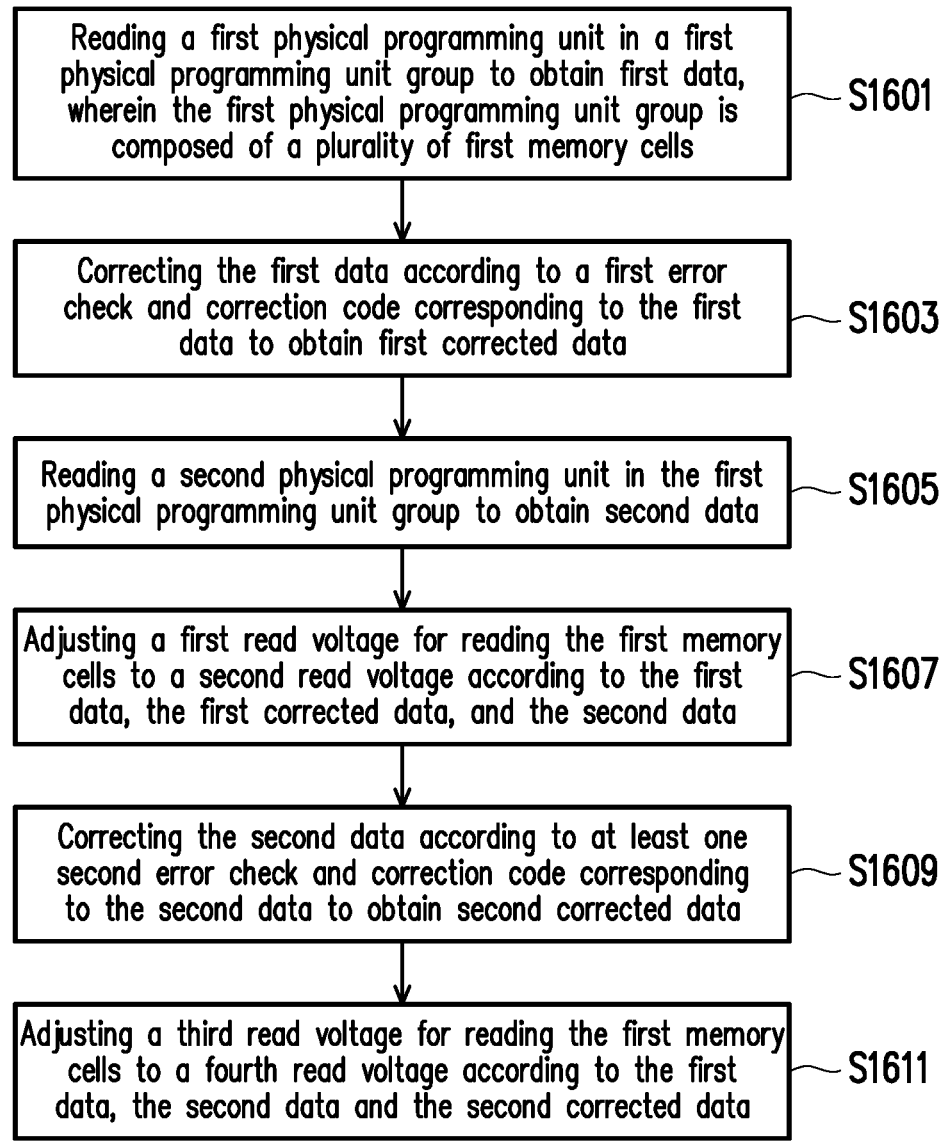
FIG. 16 is a flowchart illustrating a voltage adjusting method according to an exemplary embodiment.

FIG. 16 is a flowchart illustrating a voltage adjusting method according to an exemplary embodiment.

With reference to FIG. 16, in step S1601, the MMC 702 reads a first PPU in a first PPU group to obtain first data. Here, the first PPU group is composed of a plurality of first memory cells. In step S1603, the MMC 702 corrects the first data according to a first error check and correction code corresponding to the first data to obtain first corrected data. In step S1605, the MMC 702 reads a second PPU in the first PPU group to obtain second data. In step S1607, the MMC 702 adjusts a first read voltage for reading the first memory cells to a second read voltage according to the first data, the first corrected data, and the second data. In step S1609, the MMC 702 corrects the second data according to at least one second error check and correction code corresponding to the second data to obtain second corrected data. In step S1611, the MMC 702 adjusts a third read voltage for reading the first memory cells to a fourth read voltage according to the first data, the second data and the second corrected data.

In addition, the MMC 702 can record the second read voltage and the fourth read voltage. Later, when the MMC 702 intends to read the first memory cells again, the MMC 702 can use the second read voltage or the fourth read voltage to read the first memory cells.

Figure 17:
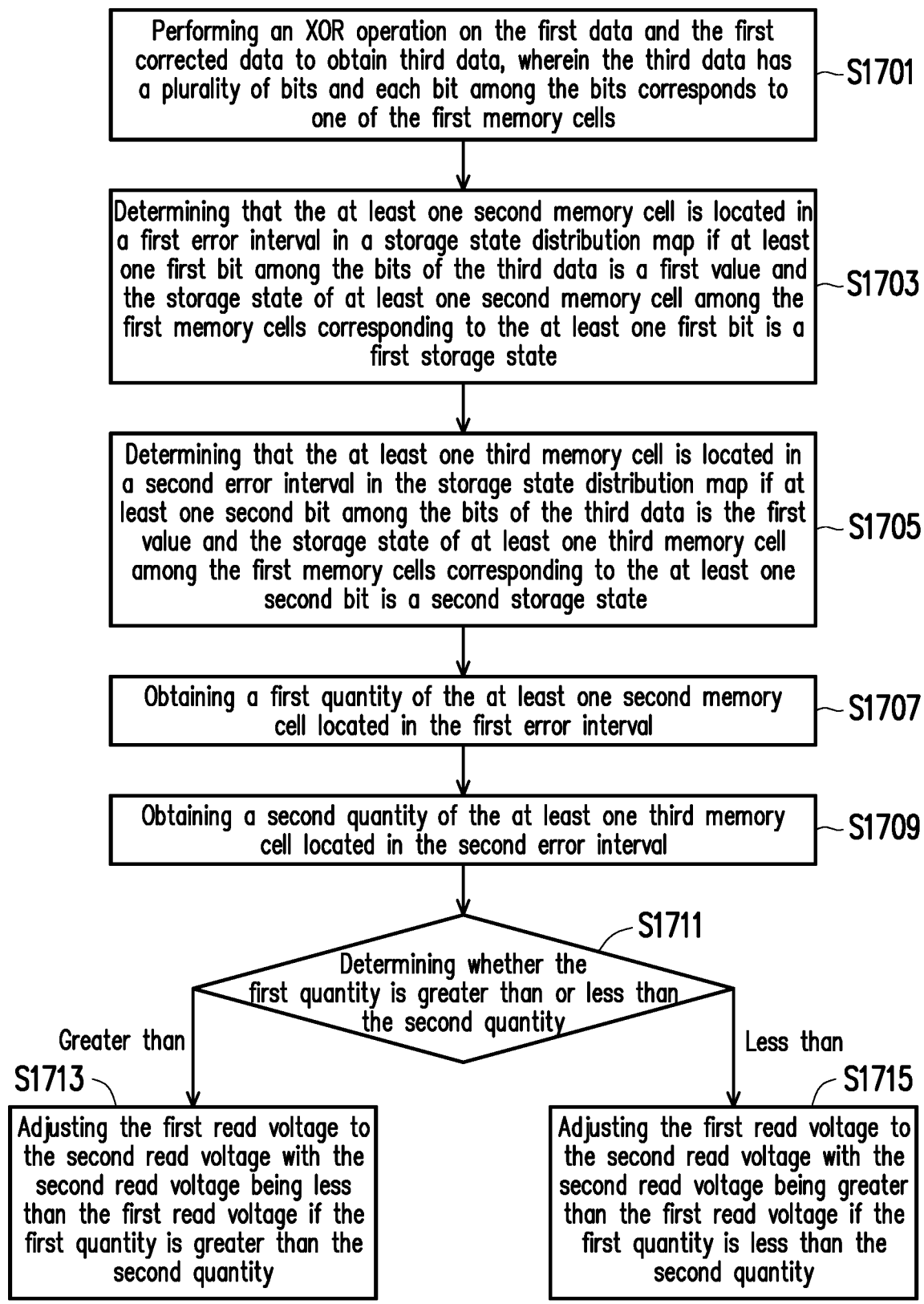
FIG. 17 is a flowchart illustrating a method for adjusting the read voltage according to the quantity of the memory cells in the error interval according to an exemplary embodiment.

FIG. 17 is a flowchart illustrating a method for adjusting the read voltage according to the quantity of the memory cells in the error interval according to an exemplary embodiment. Here, the flow in FIG. 17 is used to describe step S1607 in FIG. 16 in more details.

With reference to FIG. 17, in step S1701, the MMC 702 performs an XOR operation on the first data and the first corrected data to obtain third data, wherein the third data has a plurality of bits and each bit among the bits corresponds to one of the first memory cells. In step S1703, if at least one first bit among the bits of the third data is a first value and the storage state of at least one second memory cell among the first memory cells corresponding to the at least one first bit is a first storage state, the MMC 702 determines that the at least one second memory cell is located in a first error interval in a storage state distribution map. Here, the at least one second memory cell located in the first error interval belongs to the second storage state and yet the at least one second memory cell is identified as in the first storage state according to the first read voltage. In step S1705, if at least one second bit among the bits of the third data is the first value and the storage state of at least one third memory cell among the first memory cells corresponding to the at least one second bit is a second storage state, the MMC 702 determines that the at least one third memory cell is located in a second error interval in the storage state distribution map. Here, the at least one third memory cell located in the second error interval belongs to the first storage state and yet the at least one third memory cell is identified as in the second storage state according to the first read voltage. In step S1707, the MMC 702 obtains a first quantity of the at least one second memory cell located in the first error interval. In step S1709, the MMC 702 obtains a second quantity of the at least one third memory cell located in the second error interval. In step S1711, the MMC 702 determines whether the first quantity is greater than or less than the second quantity.

If the first quantity is greater than the second quantity, in step S1713, the MMC 702 adjusts the first read voltage to the second read voltage with the second read voltage being less than the first read voltage.

If the first quantity is less than the second quantity, in step S1715, the MMC 702 adjusts the first read voltage to the second read voltage with the second read voltage being greater than the first read voltage.

In summary, the voltage adjusting method, the memory controlling circuit unit and the memory storage device of the invention can be used to effectively calculate the optimal read voltage for reading the memory cells to be used in the subsequent reading operation. Accordingly, the probability of successful decoding may be increased and the number of retry-reads may be reduced so as to effectively improve the performance of the MMC.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A voltage adjusting method for a rewritable non-volatile memory module, wherein the rewritable non-volatile memory module comprises a plurality of memory cells, and the plurality of memory cells are disposed on intersections between a plurality of word lines and a plurality of bit lines, wherein the plurality of word lines comprise a first word line, a first physical programming unit group is formed by a plurality of first memory cells among the plurality of memory cells located on the first word line, and the voltage adjusting method comprises:

reading a first physical programming unit in the first physical programming unit group to obtain first data;

correcting the first data according to a first error check and correction code corresponding to the first data to obtain first corrected data;

reading at least one second physical programming unit in the first physical programming unit group to obtain second data; and adjusting a first read voltage for reading the plurality of first memory cells to a second read voltage according to the first data, the first corrected data, and the second data.

2. The voltage adjusting method of claim 1, wherein each memory cell among the plurality of memory cells has one of a plurality of storage states, wherein the step of adjusting the first read voltage for reading the plurality of first memory cells to the second read voltage according to the first data, the first corrected data, and the second data comprises:
performing an exclusive OR operation on the first data and the first corrected data to obtain third data, wherein the third data has a plurality of bits and each bit among the plurality of bits corresponds to one of the plurality of first memory cells.

3. The voltage adjusting method of claim 2, wherein the step of adjusting the first read voltage for reading the plurality of first memory cells to the second read voltage according to the first data, the first corrected data, and the second data further comprises:
determining the at least one second memory cell is located in a first error interval in a storage state distribution map if at least one first bit among the plurality of bits of the third data is a first value and the storage state of at least one second memory cell among the plurality of first memory cells corresponding to the at least one first bit is a first storage state among the plurality of storage states; and
determining the at least one third memory cell is located in a second error interval in the storage state distribution map if at least one second bit among the plurality of bits of the third data is the first value and the storage state of at least one third memory cell among the plurality of first memory cells corresponding to the at least one second bit is a second storage state among the plurality of storage states.

4. The voltage adjusting method of claim 3, wherein in the storage state distribution map, the first storage state is adjacent to the second storage state, the at least one second memory cell located in the first error interval belongs to the second storage state and yet the at least one second memory cell is identified as in the first storage state according to the first read voltage, and
the at least one third memory cell located in the second error interval belongs to the first storage state and yet the at least one third memory cell is identified as in the second storage state according to the first read voltage.

5. The voltage adjusting method of claim 4, wherein the step of adjusting the first read voltage for reading the plurality of first memory cells to the second read voltage according to the first data, the first corrected data, and the second data further comprises:
obtaining a first quantity of the at least one second memory cell located in the first error interval;
obtaining a second quantity of the at least one third memory cell located in the second error interval;
adjusting the first read voltage to the second read voltage with the second read voltage being less than the first read voltage if the first quantity is greater than the second quantity; and
adjusting the first read voltage to the second read voltage with the second read voltage being greater than the first read voltage if the first quantity is less than the second quantity.

6. The voltage adjusting method of claim 1, wherein after the step of adjusting the first read voltage for reading the plurality of first memory cells to the second read voltage according to the first data, the first corrected data, and the second data, the method further comprises:
recording the second read voltage; and
reading the plurality of first memory cells by using the second read voltage.

7. The voltage adjusting method of claim 1, further comprising:
correcting the second data according to at least one second error check and correction code corresponding to the second data to obtain at least one second corrected data; and
adjusting a third read voltage for reading the plurality of first memory cells to a fourth read voltage according to the first data, the second data and the at least one second corrected data.

8. A memory controlling circuit unit for a rewritable non-volatile memory module, the rewritable non-volatile memory module comprising a plurality of memory cells, the plurality of memory cells being disposed on intersections between a plurality of word lines and a plurality of bit lines, wherein the plurality of word lines comprise a first word line, a first physical programming unit group is formed by a plurality of first memory cells among the plurality of memory cells located on the first word line, and the memory controlling circuit unit comprises:
a host interface, configured to couple to a host system;
a memory interface, configured to couple to the rewritable non-volatile memory module; and
a memory management circuit, coupled to the host interface and the memory interface,
wherein the memory management circuit is configured to read a first physical programming unit in the first physical programming unit group to obtain first data,
wherein the memory management circuit is further configured to correct the first data according to a first error check and correction code corresponding to the first data to obtain first corrected data,
wherein the memory management circuit is further configured to read at least one second physical programming unit in the first physical programming unit group to obtain second data,
wherein the memory management circuit is further configured to adjust a first read voltage for reading the plurality of first memory cells to a second read voltage according to the first data, the first corrected data, and the second data.

9. The memory controlling circuit unit of claim 8, wherein each memory cell among the plurality of memory cells has one of a plurality of storage states, wherein in the operation of adjusting the first read voltage for reading the plurality of first memory cells to the second read voltage according to the first data, the first corrected data, and the second data,
the memory management circuit is further configured to perform an exclusive OR operation on the first data and the first corrected data to obtain third data, wherein the third data has a plurality of bits and each bit among the plurality of bits corresponds to one of the plurality of first memory cells.

10. The memory controlling circuit unit of claim 9, wherein in the operation of adjusting the first read voltage for reading the plurality of first memory cells to the second read voltage according to the first data, the first connected data, and the second data,
the memory management circuit is further configured to determine that the at least one second memory cell is located in a first error interval in a storage state distribution map if at least one first bit among the plurality of bits of the third data is a first value and the storage state of at least one second memory cell among the plurality of first memory cells corresponding to the at least one first bit is a first storage state among the plurality of storage states, and the memory management circuit is further configured to determine that the at least one third memory cell is located in a second error interval in the storage state distribution map if at least one second bit among the plurality of bits of the third data is the first value and the storage state of at least one third memory cell among the plurality of first memory cells corresponding to the at least one second bit is a second storage state among the plurality of storage states.

11. The memory controlling circuit unit of claim 10, wherein in the storage state distribution map, the first storage state is adjacent to the second storage state, the at least one second memory cell located in the first error interval belongs to the second storage state and yet the at least one second memory cell is identified as in the first storage state according to the first read voltage, and the at least one third memory cell located in the second error interval belongs to the first storage state and yet the at least one third memory cell is identified as in the second storage state according to the first read voltage.

12. The memory controlling circuit unit of claim 11, wherein in the operation of adjusting the first read voltage for reading the plurality of first memory cells to the second read voltage according to the first data, the first corrected data, and the second data, the memory management circuit is further configured to obtain a first quantity of the at least one second memory cell located in the first error interval, the memory management circuit is further configured to obtain a second quantity of the at least one third memory cell located in the second error interval, the memory management circuit is further configured to adjust the first read voltage to the second read voltage with the second read voltage being less than the first read voltage if the first quantity is greater than the second quantity, and the memory management circuit is further configured to adjust the first read voltage to the second read voltage with the second read voltage being greater than the first read voltage if the first quantity is less than the second quantity.

13. The memory controlling circuit unit of claim 8, wherein after the operation of adjusting the first read voltage for reading the plurality of first memory cells to the second read voltage according to the first data, the first corrected data, and the second data, the memory management circuit is further configured to record the second read voltage, and the memory management circuit is further configured to read the plurality of first memory cells by using the second read voltage.

14. The memory controlling circuit unit of claim 8, wherein the memory management circuit is further configured to correct the second data according to at least one second error check and correction code corresponding to the second data to obtain at least one second corrected data, and the memory management circuit is further configured to adjust a third read voltage for reading the plurality of first memory cells to a fourth read voltage according to the first data, the second data and the at least one second corrected data.

15. A memory storage device, comprising:
a connection interface unit, configured to couple to a host system;
a rewritable non-volatile memory module, the rewritable non-volatile memory module comprising a plurality of memory cells, the plurality of memory cells being disposed on intersections between a plurality of word lines and a plurality of bit lines, wherein the plurality of word lines comprise a first word line, and a first physical programming unit group is formed by a plurality of first memory cells among the plurality of memory cells located on the first word line; and
a memory controlling circuit unit, coupled to the connection interface unit and the rewritable non-volatile memory module,
wherein the memory controlling circuit unit is configured to read a first physical programming unit in the first physical programming unit group to obtain first data,
wherein the memory controlling circuit unit is further configured to correct the first data according to a first error check and correction code corresponding to the first data to obtain first corrected data,
wherein the memory controlling circuit unit is further configured to read at least one second physical programming unit in the first physical programming unit group to obtain second data,
wherein the memory controlling circuit unit is further configured to adjust a first read voltage for reading the plurality of first memory cells to a second read voltage according to the first data, the first corrected data, and the second data.

16. The memory storage device of claim 15, wherein each memory cell among the plurality of memory cells has one of a plurality of storage states, wherein in the operation of adjusting the first read voltage for reading the plurality of first memory cells to the second read voltage according to the first data, the first corrected data, and the second data, the memory controlling circuit unit is further configured to perform an exclusive OR operation on the first data and the first corrected data to obtain third data, wherein the third data has a plurality of bits and each bit among the plurality of bits corresponds to one of the plurality of first memory cells.

17. The memory storage device of claim 16, wherein in the operation of adjusting the first read voltage for reading the plurality of first memory cells to the second read voltage according to the first data, the first corrected data, and the second data, the memory controlling circuit unit is further configured to determine that the at least one second memory cell is located in a first error interval in a storage state distribution map if at least one first bit among the plurality of bits of the third data is a first value and the storage state of at least one second memory cell among the plurality of first memory cells corresponding to the at least one first bit is a first storage state among the plurality of storage states, and the memory controlling circuit unit is further configured to determine that the at least one third memory cell is located in a second error interval in the storage state distribution map if at least one second bit among the plurality of bits of the third data is the first value and the storage state of at least one third memory cell among the plurality of first memory cells corresponding to the at least one second bit is a second storage state among the plurality of storage states.

18. The memory storage device of claim 17, wherein in the storage state distribution map, the first storage state is adjacent to the second storage state, the at least one second memory cell located in the first error interval belongs to the second storage state and yet the at least one second memory cell is identified as in the first storage state according to the first read voltage, and the at least one third memory cell located in the second error interval belongs to the first storage state and yet the at least one third memory cell is identified as in the second storage state according to the first read voltage.

19. The memory storage device of claim 18, wherein in the operation of adjusting the first read voltage for reading the plurality of first memory cells to the second read voltage according to the first data, the first corrected data, and the second data, the memory controlling circuit unit is further configured to obtain a first quantity of the at least one second memory cell located in the first error interval, the memory controlling circuit unit is further configured to obtain a second quantity of the at least one third memory cell located in the second error interval, the memory controlling circuit unit is further configured to adjust the first read voltage to the second read voltage with the second read voltage being less than the first read voltage if the first quantity is greater than the second quantity, and the memory controlling circuit unit is further configured to adjust the first read voltage to the second read voltage with the second read voltage being greater than the first read voltage if the first quantity is less than the second quantity.

20. The memory storage device of claim 15, wherein after the operation of adjusting the first read voltage for reading the plurality of first memory cells to the second read voltage according to the first data, the first corrected data, and the second data, the memory controlling circuit unit is further configured to record the second read voltage, and the memory controlling circuit unit is further configured to read the plurality of first memory cells by using the second read voltage.

21. The memory storage device of claim 15, wherein the memory controlling circuit unit is further configured to correct the second data according to at least one second error check and correction code corresponding to the second data to obtain at least one second corrected data, and the memory controlling circuit unit is further configured to adjust a third read voltage for reading the plurality of first memory cells to a fourth read voltage according to the first data, the second data and the at least one second corrected data.

* * * * *